(12) United States Patent
Okazaki

(10) Patent No.: US 9,438,220 B2
(45) Date of Patent: Sep. 6, 2016

(54) STATE DETECTING CIRCUIT, KEY-PRESS DETECTOR, AND MUSICAL INSTRUMENT

(71) Applicant: YAMAHA CORPORATION, Hamamatsu-shi, Shizuoken (JP)

(72) Inventor: Masatsugu Okazaki, Hamamatsu (JP)

(73) Assignee: YAMAHA CORPORATION, Hamamatsu-shi (JP)

( * ) Notice: Subject to any disclaimer, the term of this patent is extended or adjusted under 35 U.S.C. 154(b) by 0 days.

(21) Appl. No.: 14/918,938

(22) Filed: Oct. 21, 2015

(65) Prior Publication Data

US 2016/0118031 A1    Apr. 28, 2016

(30) Foreign Application Priority Data

Oct. 22, 2014   (JP) .................................. 2014-215809

(51) Int. Cl.
  *H03K 17/00* (2006.01)
  *G10H 1/34* (2006.01)

(52) U.S. Cl.
  CPC .............. *H03K 17/00* (2013.01); *G10H 1/348* (2013.01); *G10H 2220/275* (2013.01); *G10H 2220/295* (2013.01)

(58) Field of Classification Search
  CPC ...................................................... H03K 17/00

USPC ........................................................... 327/24
See application file for complete search history.

(56) References Cited

U.S. PATENT DOCUMENTS

| | | | | |
|---|---|---|---|---|
| 6,670,827 | B2 * | 12/2003 | Strzalkowski | ...... H01L 25/0266 326/56 |
| 6,833,757 | B2 * | 12/2004 | Stephens | ............... H03F 1/0277 330/100 |
| 2001/0030577 | A1 * | 10/2001 | Stephens | ............... H03F 1/0277 330/207 A |
| 2003/0025525 | A1 * | 2/2003 | Strzalkowski | ..... H03K 19/0826 326/56 |
| 2005/0030066 | A1 * | 2/2005 | Sylvester | ............... H03K 5/084 327/24 |

FOREIGN PATENT DOCUMENTS

| | | |
|---|---|---|
| JP | 06176663 A | 6/1994 |
| JP | 2864914 B2 | 3/1999 |

\* cited by examiner

*Primary Examiner* — David Warren
(74) *Attorney, Agent, or Firm* — Rossi, Kimms & McDowell LLP

(57) ABSTRACT

A state detecting circuit has a first switch circuit connected to a first selection line and a second switch circuit connected to a second selection line. The first switch circuit includes two switches, and performs an arithmetic operation of ON/OFF states of the switches and a selection signal. Thus, since one switch circuit performs an arithmetic operation using ON/OFF states of the two switches, the number of selection lines and the number of parts can be reduced.

8 Claims, 13 Drawing Sheets

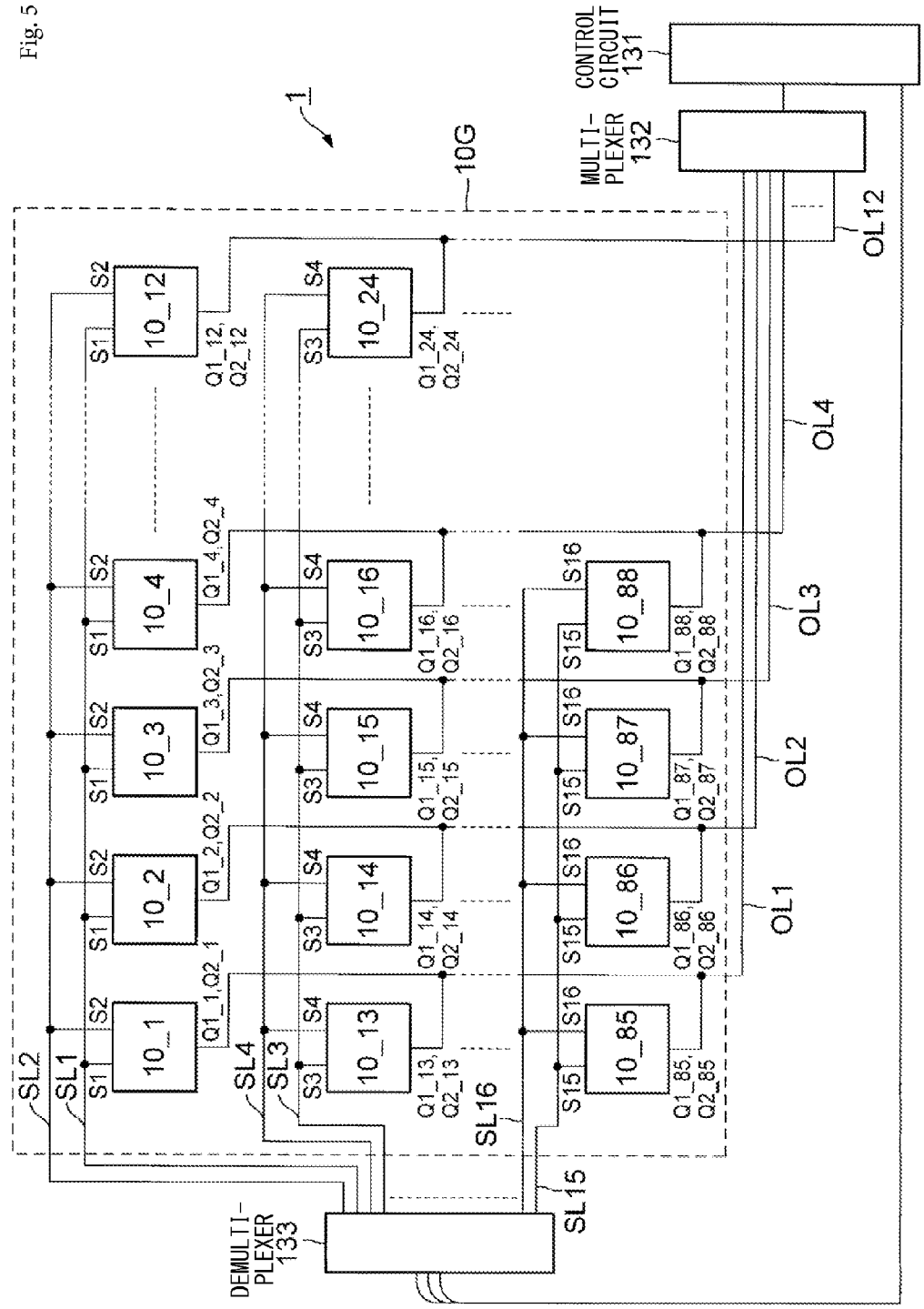

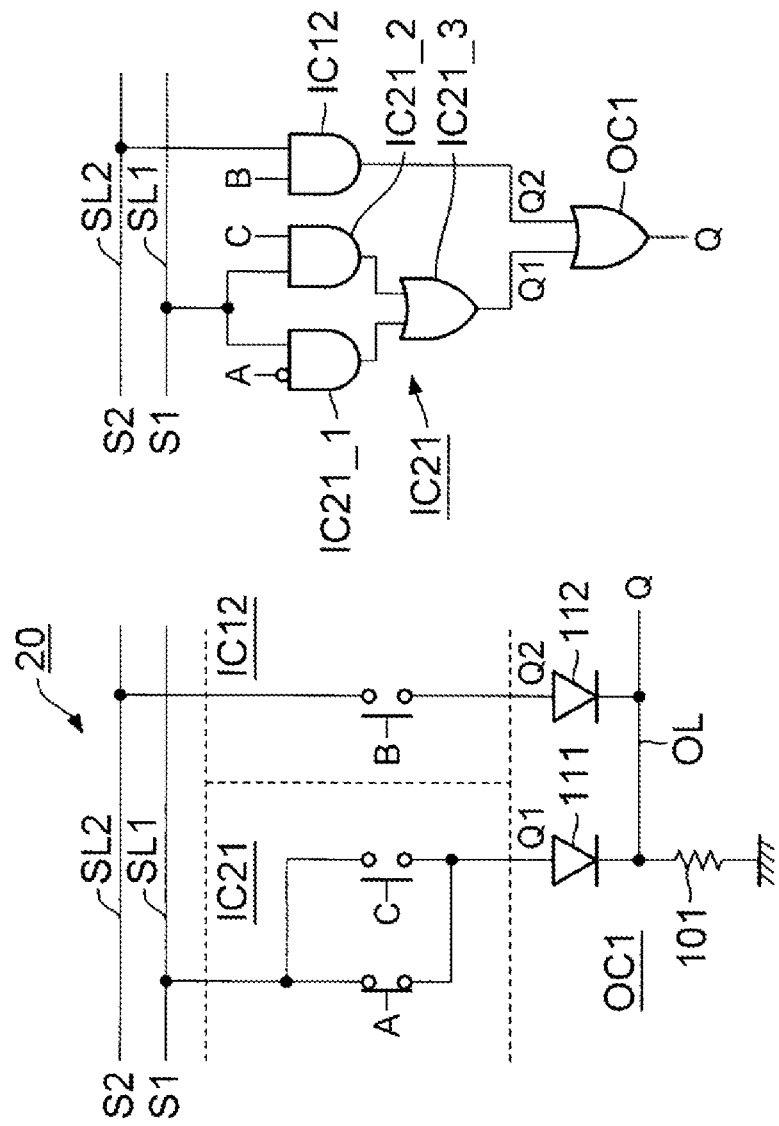
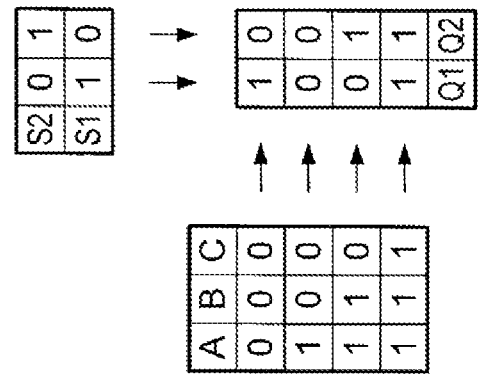
Fig. 6A  Fig. 6B  Fig. 6C

Fig. 9A
Fig. 9B
Fig. 9C
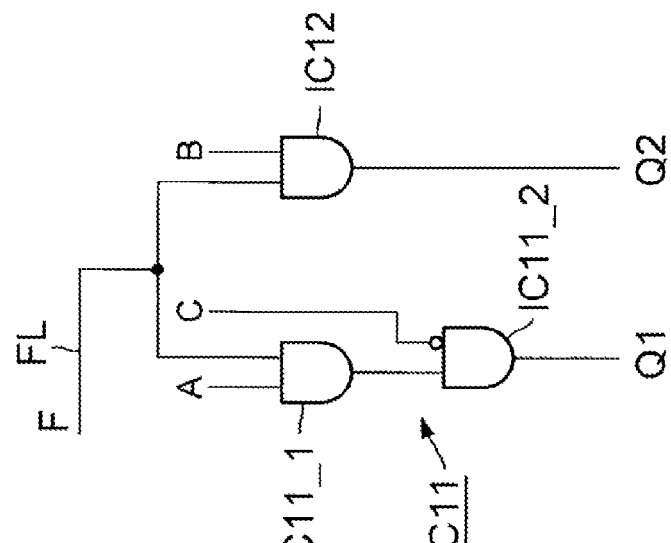
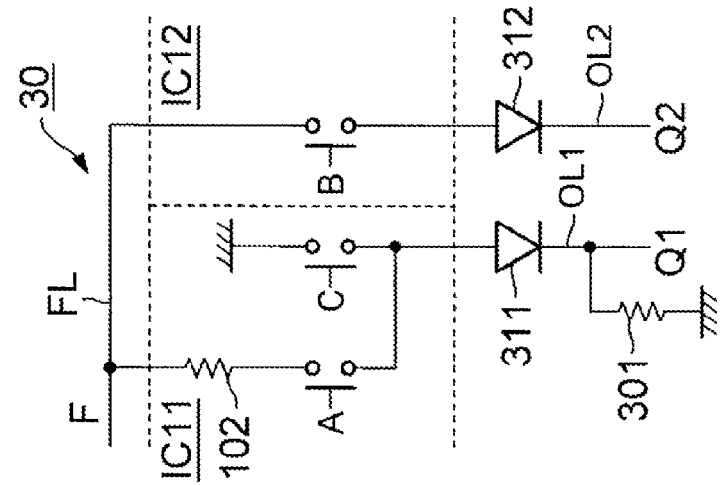

Fig. 11A

|  | Q1 | Q2 |
|---|---|---|
| th1 | 0 | 0 |
| th2 | 1 | 0 |
| th3 | 1 | 1 |
|  | 0 | 1 |

Fig. 11B

|  | Q1 | Q2 |  |
|---|---|---|---|
| th1 | 0 | 0 |  |
| th2 | 0 | 1 | X |
| th3 | 1 | 1 |  |
|  | 0 | 1 | X |

Fig. 12A

|  | Q1 | Q2 | Q3 |
|---|---|---|---|
| th1 | 0 | 0 | 0 |
| th2 | 1 | 0 | 0 |
| th3 | 1 | 1 | 0 |
| th4 | 1 | 1 | 1 |
| th5 | 1 | 0 | 1 |
|  | 0 | 0 | 1 |

Fig. 12B

|  | Q1 | Q2 | Q3 |  |
|---|---|---|---|---|
| th1 | 0 | 0 | 0 |  |
| th2 | 0 | 0 | 1 | X |
| th3 | 1 | 0 | 1 |  |
| th4 | 1 | 1 | 1 |  |
| th5 | 1 | 0 | 1 |  |
|  | 0 | 0 | 1 | X |

Fig. 12C

|  | Q1 | Q2 | Q3 |  |
|---|---|---|---|---|
| th1 | 0 | 0 | 0 |  |
| th2 | 1 | 0 | 0 |  |
| th3 | 1 | 0 | 1 | X |
| th4 | 1 | 1 | 1 |  |
| th5 | 1 | 0 | 1 | X |
|  | 0 | 0 | 1 |  |

Fig. 13A

|  | Q1 | Q2 | Q3 | Q4 |
|---|---|---|---|---|
| th1 | 0 | 0 | 0 | 0 |
| th2 | 1 | 0 | 0 | 0 |
| th3 | 1 | 1 | 0 | 0 |
| th4 | 1 | 1 | 1 | 0 |
| th5 | 1 | 1 | 1 | 1 |
| th6 | 1 | 1 | 0 | 1 |
| th7 | 1 | 0 | 0 | 1 |
|  | 0 | 0 | 0 | 1 |

Fig. 13B

|  | Q1 | Q2 | Q3 | Q4 |
|---|---|---|---|---|
| th1 | 0 | 0 | 0 | 0 |
| th2 | 1 | 0 | 0 | 0 |
| th3 | 1 | 1 | 0 | 0 |
| th4 | 1 | 1 | 1 | 0 |
| th5 | 1 | 1 | 1 | 1 |
| th6 | 1 | 0 | 1 | 1 |
| th7 | 1 | 0 | 0 | 1 |
|  | 0 | 0 | 0 | 1 |

Fig. 14A

|     | Q1 | Q2 |     |
|-----|----|----|-----|
|     | 0  | 0  | X1a |
| th1 |    |    |     |
|     | 1  | 0  | X2a |
| th2 |    |    |     |
|     | 1  | 1  |     |
| th3 |    |    |     |
|     | 1  | 0  | X2b |
| th4 |    |    |     |
|     | 0  | 0  | X1b |

Fig. 14B

|     | Q1 | Q2 |    |
|-----|----|----|----|
|     | 0  | 0  | Xa |
| th1 |    |    |    |
|     | 1  | 0  |    |
| th2 |    |    |    |
|     | 1  | 1  |    |
| th3 |    |    |    |
|     | 0  | 1  |    |
| th4 |    |    |    |
|     | 0  | 0  | Xb |

Fig. 14C

|     | Q1 | Q2 |    |
|-----|----|----|----|
|     | 0  | 0  | Xa |
| th1 |    |    |    |
|     | 1  | 0  |    |
| th2 |    |    |    |
|     | 0  | 0  | Xc |
| th3 |    |    |    |
|     | 0  | 1  |    |
| th4 |    |    |    |
|     | 0  | 0  | Xb |

Fig. 15A

|     | Q1 | Q2 | Q3 |
|-----|----|----|----|
|     | 0  | 0  | 0  |
| th1 |    |    |    |
|     | 1  | 0  | 0  |
| th2 |    |    |    |
|     | 1  | 1  | 0  |
| th3 |    |    |    |
|     | 1  | 1  | 1  |
| th4 |    |    |    |
|     | 1  | 0  | 1  |
| th5 |    |    |    |
|     | 0  | 0  | 1  |

Fig. 15B

|     | Q1 | Q2 | Q3 |
|-----|----|----|----|
|     | 0  | 0  | 0  |
| th1 |    |    |    |
| th2 | 1  | 0  | 0  |
| th3 | 1  | 0  | 1  |
|     | 1  | 1  | 1  |
| th4 |    |    |    |
|     | 0  | 1  | 1  |
| th5 |    |    |    |
|     | 0  | 0  | 1  |

Fig. 15C

|     | Q1 | Q2 | Q3 | Q4 |
|-----|----|----|----|----|
|     | 0  | 0  | 0  | 0  |
| th1 |    |    |    |    |
| th2 | 1  | 0  | 0  | 0  |
| th3 | 1  | 0  | 1  | 0  |
|     | 0  | 0  | 1  | 0  |
| th4 |    |    |    |    |
| th5 | 0  | 1  | 1  | 0  |
| th6 | 0  | 1  | 1  | 1  |
|     | 0  | 0  | 1  | 1  |

Fig. 15D

|     | Q1 | Q2 | Q3 |
|-----|----|----|----|
|     | 0  | 0  | 0  |
| th1 |    |    |    |
|     | 1  | 0  | 0  |
| th2 |    |    |    |
|     | 1  | 1  | 0  |
| th3 |    |    |    |
| th4 | 0  | 1  | 0  |
| th5 | 0  | 1  | 1  |
|     | 0  | 0  | 1  |

Fig. 15E

|     | Q1 | Q2 | Q3 | Q4 |
|-----|----|----|----|----|
|     | 0  | 0  | 0  | 0  |
| th1 |    |    |    |    |
| th2 | 1  | 0  | 0  | 0  |
| th3 | 1  | 0  | 1  | 0  |
| th4 | 0  | 0  | 1  | 0  |
| th5 | 0  | 0  | 1  | 1  |
| th6 | 0  | 1  | 1  | 1  |
| th7 | 0  | 1  | 0  | 1  |
|     | 0  | 0  | 0  | 1  |

Fig. 16A

|  | Q1 | Q2 | Q3 |
|---|---|---|---|
| th1 | 0 | 0 | 0 |
|  | 1 | 0 | 0 |
| th2 |  |  |  |
| th3 | 1 | 1 | 0 |
|  | 0 | 1 | 0 |
| th4 |  |  |  |
| th5 | 0 | 1 | 1 |
|  | 0 | 0 | 1 |
| th6 | 0 | 0 | 0 |

Fig. 16B

|  | Q1 | Q2 | Q3 |
|---|---|---|---|
| th1 | 0 | 0 | 0 |
|  | 1 | 0 | 0 |
| th2 |  |  |  |
|  | 1 | 1 | 0 |
| th3 |  |  |  |
|  | 1 | 1 | 1 |
| th4 |  |  |  |
|  | 0 | 1 | 1 |
| th5 |  |  |  |
|  | 0 | 0 | 1 |
| th6 | 0 | 0 | 0 |

Fig. 17

|  | Q1 | Q2 | Q3 | Q4 | Q5 | Q6 | Q7 | Q8 | Q9 | Qa | Qb | Qc | Qd | Qe |  |
|---|---|---|---|---|---|---|---|---|---|---|---|---|---|---|---|
| th1 | 0 | 0 | 0 | 0 | 0 | 0 | 0 | 0 | 0 | 0 | 0 | 0 | 0 | 0 | X1 |
| th2 | 1 | 0 | 0 | 0 | 0 | 0 | 0 | 0 | 0 | 0 | 0 | 0 | 0 | 0 |  |
| th3 | 1 | 1 | 0 | 0 | 0 | 0 | 0 | 0 | 0 | 0 | 0 | 0 | 0 | 0 |  |
|  | 1 | 1 | 1 | 0 | 0 | 0 | 0 | 0 | 0 | 0 | 0 | 0 | 0 | 0 | tha |
| th4 | 1 | 1 | 1 | 0 | 0 | 0 | 0 | 0 | 0 | 1 | 0 | 0 | 0 | 0 |  |
| th5 | 1 | 1 | 0 | 0 | 0 | 0 | 0 | 0 | 0 | 1 | 0 | 0 | 0 | 0 |  |
| th6 | 1 | 0 | 0 | 0 | 0 | 0 | 0 | 0 | 0 | 1 | 0 | 0 | 0 | 0 |  |
|  | 0 | 0 | 0 | 0 | 0 | 0 | 0 | 0 | 0 | 1 | 0 | 0 | 0 | 0 | X2 |
| th7 | 0 | 0 | 0 | 1 | 0 | 0 | 0 | 0 | 0 | 1 | 0 | 0 | 0 | 0 |  |
|  | 0 | 0 | 0 | 1 | 0 | 0 | 0 | 0 | 0 | 1 | 0 | 0 | 0 | 0 | thb |
| th8 | 0 | 0 | 0 | 1 | 0 | 0 | 0 | 0 | 0 | 1 | 1 | 0 | 0 | 0 |  |
|  | 0 | 0 | 0 | 1 | 1 | 0 | 0 | 0 | 0 | 1 | 1 | 0 | 0 | 0 |  |
| th9 | 0 | 0 | 0 | 1 | 1 | 1 | 0 | 0 | 0 | 1 | 1 | 0 | 0 | 0 |  |
| th10 | 0 | 0 | 0 | 0 | 1 | 1 | 0 | 0 | 0 | 1 | 1 | 0 | 0 | 0 |  |
| th11 | 0 | 0 | 0 | 0 | 0 | 1 | 0 | 0 | 0 | 1 | 1 | 0 | 0 | 0 |  |
| th12 | 0 | 0 | 0 | 0 | 0 | 0 | 0 | 0 | 0 | 1 | 1 | 0 | 0 | 0 | X3 |
| th13 | 0 | 0 | 0 | 0 | 0 | 0 | 1 | 0 | 0 | 1 | 1 | 0 | 0 | 0 |  |
|  | 0 | 0 | 0 | 0 | 0 | 0 | 1 | 0 | 0 | 1 | 1 | 1 | 0 | 0 | thc |
| th14 | 0 | 0 | 0 | 0 | 0 | 0 | 0 | 0 | 0 | 1 | 1 | 1 | 0 | 0 | X4 |
| th15 | 0 | 0 | 0 | 0 | 0 | 0 | 0 | 1 | 0 | 1 | 1 | 1 | 0 | 0 |  |
|  | 0 | 0 | 0 | 0 | 0 | 0 | 0 | 1 | 0 | 1 | 1 | 1 | 1 | 0 | thd |
| th16 | 0 | 0 | 0 | 0 | 0 | 0 | 0 | 0 | 0 | 1 | 1 | 1 | 1 | 0 | X5 |
| th17 | 0 | 0 | 0 | 0 | 0 | 0 | 0 | 0 | 1 | 1 | 1 | 1 | 1 | 0 |  |
|  | 0 | 0 | 0 | 0 | 0 | 0 | 0 | 0 | 1 | 1 | 1 | 1 | 1 | 1 | the |
| th18 | 0 | 0 | 0 | 0 | 0 | 0 | 0 | 0 | 0 | 1 | 1 | 1 | 1 | 1 | X6 |

STATE DETECTING CIRCUIT, KEY-PRESS DETECTOR, AND MUSICAL INSTRUMENT

TECHNICAL FIELD

The invention relates to a state detecting circuit which detects an ON/OFF state of a switch which switches between the ON state and the OFF state according to a change in a physical amount, and a key-press detector and musical instrument utilizing such a state detecting circuit.

BACKGROUND ART

As one example of a state detecting circuit of this type, there is a key press detecting circuit which detects a key press of a keyboard instrument. FIG. 18 is a circuit diagram illustrating a configuration example of a state detecting circuit for one key provided in this type of key press detecting circuit. In this example, three switches A, B, C are provided for one key of the keyboard. Here, the switch A switches from OFF to ON when a key press depth exceeds a threshold th1. Further, the switch B switches from OFF to ON when the key press depth exceeds a threshold th2 (>th1). Further, the switch C switches from OFF to ON when the key press depth exceeds a threshold th3 (>th2). The state detecting circuit illustrated in FIG. 18 is to detect the ON/OFF states of these switches A, B, and C.

As illustrated in FIG. 18, the state detecting circuit for one key is constituted of switches A, B, C, diodes Da, Db, Dc, and a resistance R. Here, respective anodes of the diodes Da, Db, and Dc are connected to selection lines SL1, SL2, and SL3, respectively. Further, respective cathodes of the diodes Da, Db, and Dc are connected to respective one ends of the switches A, B, and C. Further, respective other ends of the switches A, B, and C are connected to one end of the resistance R, and the other end of this resistance R is grounded. A common connection point of the switches A, B, C and the resistance R is connected to an output signal line OL.

In FIG. 18, selection signals S1, S2, and S3 which sequentially become H (high) level are respectively outputted to the selection lines SL1, SL2, and SL3. In a period in which the selection signal S1 is at the H level and the selection signals S2 and S3 are at L (low) level, the diodes Db and Dc are in the OFF states. In this period, if the switch A is in the ON state, the selection signal S1 is applied to the resistance R via the diode Da and the switch A. As a result, a state signal Q at the H level is outputted to the output signal line OL. On the other hand, if the switch A is in the OFF state, since the output signal line OL is grounded via the resistance R, a state signal Q at the L level is outputted to the output signal line OL. Further, in a period in which the selection signal S2 is at the H level and the selection signals S1 and S3 are at the L level, the diodes Da and Dc are in the OFF state. Thus, the state signal Q at the level according to ON/OFF state of the switch B is outputted to the output signal line OL. Further, in a period in which the selection signal S3 is at the H level and the selection signals S1 and S2 are at the L level, the diodes Da and Db are in the OFF state. Thus, the state signal Q at the level according to ON/OFF state of the switch C is outputted to the output signal line OL.

The key press detecting circuit using this state detecting circuit monitors the state signal Q outputted to the output signal line OL while cyclically repeating the operation to sequentially change the selection signals S1, S2, and S3 to the H level, and detects the timing at which each of the switches A, B, and C switches from the OFF state to the ON state. Then a calculation of velocity, and/or the like is performed based on detection results of the timings of ON-OFF switching of the switches. Incidentally, as a technical document related to the key press detecting circuit, there is PTL1.

CITATION LIST

Patent Literature

{PTL1} JP 2864914 B

SUMMARY OF INVENTION

Technical Problem

Incidentally, the above-described conventional state detecting circuit requires three selection lines SL1, SL2, SL3 and three diodes Da, Db, Dc to detect the ON/OFF states of the three switches. When they are applied to key press detecting circuits of a keyboard having a large number of keys, the amount of wires of selection lines becomes large and the number of diodes used increases, posing a problem of making the key press detecting circuit expensive.

The invention has been made in view of the situation explained above, and it is an object thereof to reduce the number of signal lines and the number of parts of the state detecting circuit.

Solution to Problem

The invention provides a state detecting circuit having a plurality of switch circuits (IC11 and IC12 of FIG. 2A) each including at least one switch (A, B, and C of FIG. 2A) which switches between ON state and OFF state in response to a change in a physical amount (key press depth in the embodiment of FIG. 2A) which is a target of detection, and each of the switch circuits outputting a state signal (Q1, Q2 of FIG. 2A) which changes according to an ON/OFF state of the switch included in the switch circuit itself, wherein the plurality of the switch circuits include one or a plurality of three-state switch circuit (IC11 of FIG. 2A) including two switches (A, C) in which thresholds of the physical amount at which the switch switches between the ON state and the OFF state are different from each other, inverting the state signal (Q1) when the physical amount exceeds a smaller one of the thresholds of the two switches, and further inverting the state signal when the physical amount exceeds a larger one of the thresholds of the two switches.

According to the invention, since the plurality of switch circuits includes one or a plurality of three-state switch circuits including two switches, the number of switch circuits can be reduced with respect to the number of switches, and the number of signal lines to each switch circuit and the number of parts for taking out a state signal from each switch circuit can be reduced.

In a preferred aspect, the plurality of switch circuits include at least one two-state switch circuit (IC12 of FIG. 2A) having a threshold between the thresholds of the two switches of the three-state switch circuit (IC11 of FIG. 2A), and inverting the state signal (Q2 of FIG. 2A) when the physical amount exceeds the threshold.

In this aspect, a section where the physical amount is smaller than the smaller one of the thresholds of the two switches of the three-state switch circuit, and a section where the physical amount is larger than the larger one of the thresholds of the two switches of the three-state switch circuit, are duplicated sections where the state signal outputted by the three-state switch circuit is common. However, these duplicated sections can be distinguished by a state signal outputted by the two-state switch circuit.

In another preferred aspect, the plurality of switch circuits include the plurality of three-state switch circuits, and the switch of the two-state switch circuit has, assuming that the thresholds (th1 to th7 of FIG. 13B) of the physical amount at which the respective switches of the plurality of switch circuits switches between the ON state and the OFF state are sorted in ascending order, a threshold (th4) in a next order of a largest threshold (th3) among the smaller thresholds (th1, th2, th3) among the thresholds (th1, th2, th3, th5, th6, th7) of the respective two switches of the plurality of three-state switch circuits (FIG. 13B).

When multiple three-state switch circuits are present, regarding each three-state switch circuit, duplication of state signals occurs in a section where the physical amount is smaller than a smaller one of thresholds of two switches of the three-state switch circuit and a section where the physical amount is larger than a larger threshold thereof. However, when the threshold of the two-state switch circuit is set as above, it is possible to distinguish the sections where the state signals are common by a state signal outputted by the two-state switch circuit for all of the three-state switch circuits.

In another preferred aspect, the plurality of switch circuits include the plurality of three-state switch circuits, sections between the thresholds of the respective two switches of the plurality of three-state switch circuits have an inclusion relation (th1, th2, th4, th5 of FIG. 15A), and a switch of the two-state switch circuit has a threshold (th3) inside an innermost section (between th2 and th4 of FIG. 15A) among the sections having the inclusion relation.

In this case, one or a plurality of pairs of duplicated sections sandwiching the innermost section of the sections having an inclusion relation exist. Sections in each pair of the duplicated sections can be distinguished from each other by a state signal outputted by the two-state switch circuit.

In another preferred aspect, the plurality of switch circuits include the plurality of three-state switch circuits, and in the plurality of the three-state switch circuits, a section (between th1 and th4 of FIG. 15B) between the thresholds of the two switches of at least one of the three-state switch circuits overlaps with a section (between th3 and th5 of FIG. 15B) between the thresholds of the two switches of another one of the three-state switch circuits, and a switch of the two-state switch circuit has a threshold between a largest threshold (th5) and a smallest threshold (th1) among the thresholds of the respective switches of the plurality of three-state switch circuits.

In this case, duplication of state signals occurs in a section of a smaller physical amount than the smallest threshold among the thresholds of the switches of the plurality of three-state switch circuits and a section of a larger physical amount than the largest threshold thereof. However, these duplicated sections can be distinguished from each other by a state signal outputted by the two-state switch circuit.

In another preferred aspect, the plurality of switch circuits include, as the plurality of three-state switch circuits, two three-state switch circuits in which sections between the thresholds of the two switches of the respective three-state switch circuits do not overlap with each other, and has, as the at least one two-state switch circuit, a two-state switch circuit having a switch with a threshold between thresholds of the two switches of one of the two three-state switch circuits and a two-state switch circuit having a switch with a threshold between thresholds of the two switches of another one of the two three-state switch circuits.

In this case, duplication of state signals occurs in a section between the thresholds of the two switches of one of the two three-state switch circuit, a section of a smaller physical amount than the smallest threshold among the thresholds of the switches of each three-state switch circuit, and a section of a larger physical amount than the largest threshold thereof. However, these duplicated sections can be distinguished from one another by state signals outputted by the two-state switch circuits.

BRIEF DESCRIPTION OF DRAWINGS

FIG. 5 is a block diagram illustrating a detailed configuration example of the key press detecting circuit 1 in FIG. 1.

FIG. 6A is a circuit diagram illustrating a configuration of the state detecting circuit 20 as a second embodiment of the invention.

FIG. 6B is a logic circuit diagram illustrating a configuration of the same.

FIG. 6C illustrates truth tables illustrating operation of the same.

FIG. 9A is a circuit diagram illustrating a configuration of the state detecting circuit 30 as a third embodiment of the invention.

FIG. 9B is a logic circuit diagram illustrating a configuration of the same.

FIG. 9C illustrates truth tables illustrating operation of the same.

FIG. 11A is a truth table for explaining principles of a state detecting circuit as a fourth embodiment of the invention.

FIG. 11B is another truth table for explaining the same.

FIG. 12A is still another truth table for explaining the same.

FIG. 12B is still another truth table for explaining the same.

FIG. 12C is still another truth table for explaining the same.

FIG. 13A is still another truth table for explaining the same.

FIG. 13B is still another truth table for explaining the same.

FIG. 14A is a truth table for explaining principles of a state detecting circuit as a fifth embodiment of the invention.

FIG. 14B is another truth table for explaining the same.

FIG. 14C is still another truth table for explaining the same.

FIG. 15A is still another truth table for explaining the same.

FIG. 15B is still another truth table for explaining the same.

FIG. 15C is still another truth table for explaining the same.

FIG. 15D is still another truth table for explaining the same.

FIG. 15E is still another truth table for explaining the same.

FIG. 16A is still another truth table for explaining the same.

FIG. 16B is still another truth table for explaining the same.

FIG. 17 is still another truth table for explaining the same.

DESCRIPTION OF EMBODIMENTS

Hereinafter, embodiments of the invention will be explained with reference to the drawings.

First Embodiment

Figure 1:
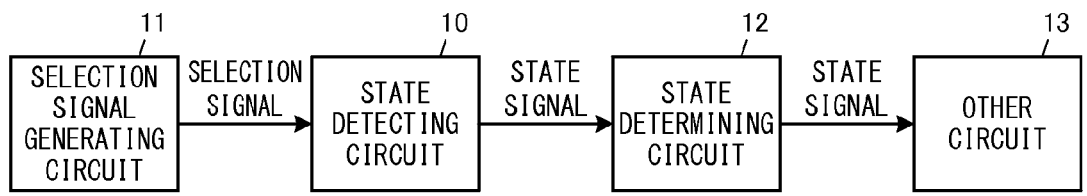
FIG. 1 is a block diagram illustrating a configuration of a key press detecting circuit 1 using a state detecting circuit 10 as a first embodiment of the invention.

FIG. 1 is a block diagram illustrating a configuration of a key press detecting circuit 1 using a state detecting circuit 10 as a first embodiment of the invention. Note that in FIG. 1, to facilitate understanding, the configuration of a circuit for one key is illustrated out of circuits constituting a key press detecting circuit 1. As illustrated in FIG. 1, the key press detecting circuit 1 has a state detecting circuit 10 corresponding to each key of a keyboard, a selection signal generating circuit 11, a state determining circuit 12, and another circuit 13. Note that in this embodiment, the invention is applied to a state detecting circuit which detects a key press depth of a keyboard, but the applications of the invention is not limited to this range.

The selection signal generating circuit 11 supplies the state detecting circuit 10 with a selection signal which switches its level at a constant cycle. The state detecting circuit 10 detects an ON/OFF state of a switch which switches between an ON state and an OFF state according to a key press depth of one key of the keyboard, and outputs a detection result as a state signal to the state determining circuit 12. The state determining circuit 12 determines the key press depth of the one key of the keyboard based on the state signal outputted from the state detecting circuit 10. The other circuit 13 is a circuit calculating the velocity of a key press based on, for example, the key press depth determined by the state determining circuit 12, or the like.

Figure 2C:
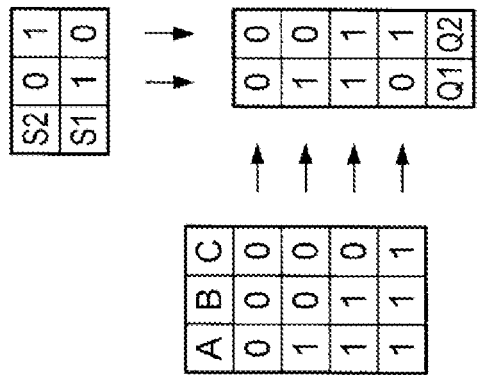
FIG. 2C illustrates truth tables illustrating operation of the same.
Figure 2B:
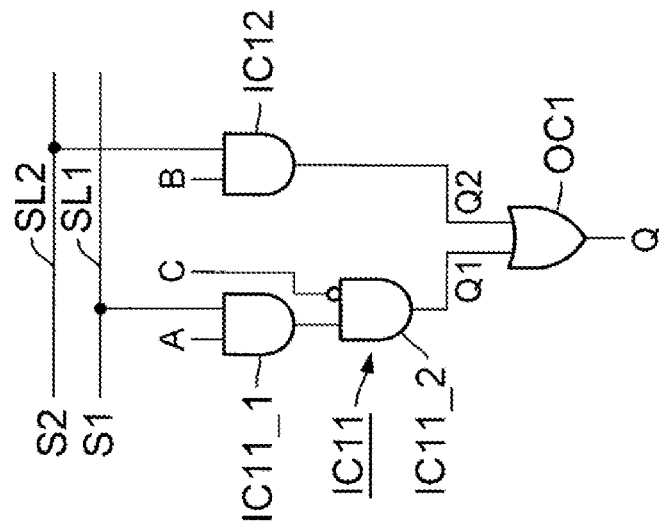
FIG. 2B is a logic circuit diagram illustrating a configuration of the same.
Figure 2A:
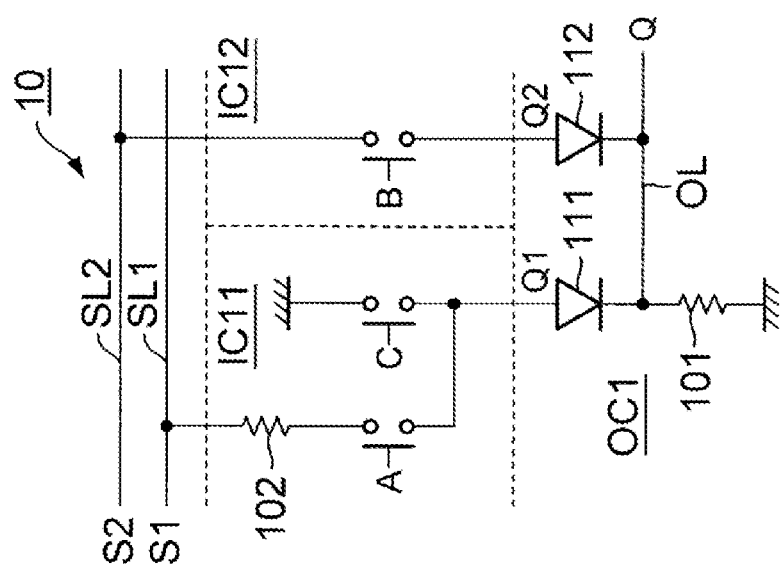
FIG. 2A is a circuit diagram illustrating a configuration of the state detecting circuit 10 in FIG. 1.

FIG. 2A is a circuit diagram illustrating a configuration of the state detecting circuit 10 for one key according to the embodiment. As illustrated in FIG. 2A, the state detecting circuit 10 for one key includes switch circuits IC11 and IC12 and a logical sum circuit OC1.

Figure 18:
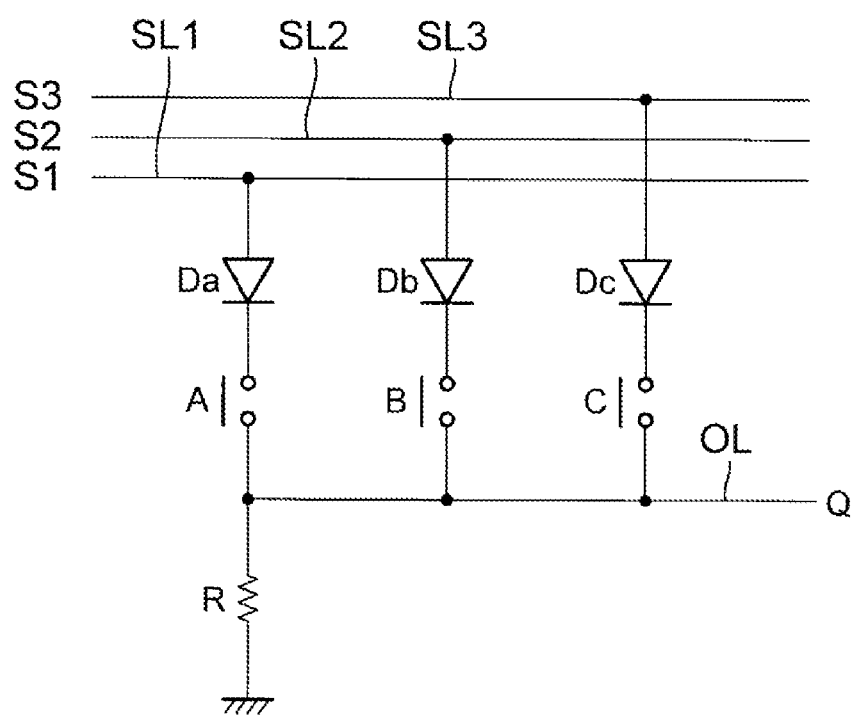
FIG. 18 is a circuit diagram illustrating a configuration example of a conventional state detecting circuit.

In FIG. 2A, the switch circuit IC11 includes switches A and C, and the switch circuit IC12 includes a switch B. Here, the switches A, B, and C are key-on switches which switch from the OFF state to the ON state when the key press depth exceeds a predetermined threshold, similarly to the switches in previous FIG. 18. Here, there is a relation th1<th2<th3 among a threshold th1 of the key press depth at which ON/OFF of the switch A switches, a threshold th2 of the key press depth at which ON/OFF of the switch B switches, and a threshold th3 of the key press depth at which ON/OFF of the switch C switches. That is, when the key press depth is increased from zero, the switch A switches from the OFF state to the ON state when the key press depth exceeds the threshold th1. Then the switch B switches from the OFF state to the ON state when the key press depth exceeds the threshold th2. Finally, the switch C switches from the OFF state to the ON state when the key press depth exceeds the threshold th3.

The switch circuit IC11 is supplied with a selection signal S1 via a selection line SL1 from the selection signal generating circuit 11, and the switch circuit IC12 is supplied with a selection signal S2 via a selection line SL2 from the selection signal generating circuit 11. The selection signals S1 and S2 are alternating signals each of which alternately becomes the H level at a constant cycle. More specifically, when the selection signal S1 is at the H level, the selection signal S2 is at the L level, and when the selection signal S2 is at the H level, the selection signal S1 is at the L level.

The switch circuit IC11 includes a resistance 102 in addition to the switches A and C. Here, the resistance 102 has one end connected to the selection line SL1 and the other end connected to one end of the switch A. The other end of the switch A is connected to one end of the switch C. The other end of the switch C is connected to a reference power line (ground line in this embodiment). Then, a common connection point of the switches A and C is an output terminal of the switch circuit IC11 outputting a state signal Q1. The switch circuit IC11 performs a logical operation based on the selection signal S1 and the ON/OFF states of the switches A and C, and outputs a state signal Q1 indicating the logical operation result to the logical sum circuit OC1.

The switch circuit IC12 includes one switch B. The switch B is interposed between the selection line SL2 and an output terminal of the switch circuit IC12. The switch circuit IC12 performs a logical operation based on the selection signal S2 and the ON/OFF state of the switch B, and outputs a state signal Q2 indicating the logical operation result to the logical sum circuit OC1.

The logical sum circuit OC1 includes a diode 111, a diode 112 and a resistance 101. Here, an anode of the diode 111 is connected to a common connection point of the switches A and C which is an output terminal of the switch circuit IC11, and an anode of the diode 112 is connected to one end of the switch B which is an output terminal of the switch circuit IC12. Further, cathodes of the diodes 111 and 112 are connected in common, and a resistance 101 is interposed between the common connection point of the cathodes and the reference power line (ground line in this embodiment). Then, the common connection point of the cathodes of the diodes 111 and 112 is an output terminal of the logical sum circuit OC1. The logical sum circuit OC1 outputs as a state signal Q a logical sum of the state signal Q1 outputted by the switch circuit IC11 and the state signal Q2 outputted by the switch circuit IC12.

FIG. 2B is an equivalent logic circuit diagram in which the elements of the state detecting circuit 10 illustrated in FIG. 2A are replaced with logical symbols. Signals A, B and C in the diagram indicate ON and OFF of the switches A, B and C as 1 and 0, respectively.

In FIG. 2A, the resistance value of the resistance 102 is sufficiently lower than that of the resistance 101, and the division ratio of the resistance 102 and the resistance 101 is close to 1. Therefore, when the selection signal S1 is at the H level, the switch A is in the ON state, and the switch C is in the OFF state, the state signal Q1 outputted by the switch circuit IC11 is at a voltage resulted from dividing the selection signal S1 (representing "1"=H level) by the resistances 102 and 101, that is, H level (="1").

On the other hand, when the switch C is in the ON state, even if the selection signal S1 is at the H level and the switch A is in the ON state, the state signal Q1 outputted by the switch circuit IC11 is at the L level.

Further, when the switches A and C are in the OFF state, the state signal Q1 outputted by the switch circuit IC11 is at the L level irrespective of the level of the selection signal S1 supplied to the switch circuit IC11.

Thus, the state signal Q1 represents "1" (=H level) only when the selection signal S1 represents "1" (=H level) and the switch A is in the ON state (="1"), and further the switch C is in the OFF state (="0").

Therefore, the switch circuit IC11 is, as illustrated in FIG. 2B, equivalent to a logic circuit constituted of a logical product circuit IC11_1 performing a logical product operation of the signal A and the selection signal S1, and a logical product circuit IC11_2 performing a logical product operation of an output signal of the logical product circuit IC11_1 and a signal resulted from logically inverting the signal C and outputting the operation result as the state signal Q1 to the logical sum circuit OC1.

Further, in FIG. 2A, the state signal Q2 outputted by the switch circuit IC12 represents "1" (=H level) only when the selection signal S2 represents "1" (=H level) and the switch B is in the ON state (="1"). Therefore, the switch circuit IC12 is equivalent to a logical product circuit IC12 which outputs a logical product of the signal B and the selection signal S2 as the state signal Q2, as illustrated in FIG. 2B.

In the logical sum circuit OC1, the diode 111 is in the ON state when the state signal Q1 given to the anode of the diode 111 represents "1" (=H level), and the logical sum circuit OC1 outputs the state signal Q1 representing "1" (=H level) as the state signal Q.

Here, when the state signal Q2 represents "0" (=L level), the diode 112 is in the OFF state. Therefore, the state signal Q (=Q1 in this case) outputted by the logical sum circuit OC1 is not affected by the state signal Q2.

Further, in the logical sum circuit OC1, when the state signal Q2 given to the anode of the diode 112 represents "1" (=H level), the diode 112 is in the ON state and the logical sum circuit OC1 outputs the state signal Q2 representing "1" (=H level) as the state signal Q.

Here, when the state signal Q1 represents "0" (=L level), the diode 111 switches to the OFF state. Therefore, the state signal Q (=Q2 in this case) outputted by the logical sum circuit OC1 is not affected by the state signal Q1.

Then, when the state signals Q1 and Q2 respectively represent "1" (=H level), the diodes 111 and 112 switches to the ON state, and the logical sum circuit OC1 outputs the state signal Q representing "1" (=H level). Thus, the logical sum circuit OC1 outputs a logical sum of the state signals Q1 and Q2 as the state signal Q.

FIG. 2C is a truth table illustrating operation of the state detecting circuit 10 in this embodiment. In FIG. 2C, the ON state of the switches A, B and C is indicated as "1" and the OFF state thereof indicated as "0". Further, regarding the selection signals S1 and S2 and the state signals Q1 and Q2, the state at the H level is indicated as "1" and the state at the L level is indicated as "0". Further, as described above, thresholds of the key press depth at which the ON/OFF of the switches A, B, and C switches are respectively th1, th2, and th3 (th1<th2<th3).

The left truth table of FIG. 2C illustrates in a vertical direction transitions of the ON/OFF states of the respective switches A, B, and C when the key press depth is increased. In a state that there is no key press, the ON/OFF states of the switches A, B, and C are "000". Further, when the key is pressed and it becomes a state of "th1<key press depth<th2", the ON/OFF states of the switches A, B, and C are "100". Further, when it becomes a state of "th2<key press depth<th3", the ON/OFF states of the switches A, B, and C are "110". Then, when it becomes a state of "key press depth>th3", the ON/OFF states of the switches A, B, and C are "111". Thus, the ON/OFF states of the switches A, B, and C can be any one of four states, "000", "100", "110", and "111", depending on the key press depth.

The right bottom truth table of FIG. 2C illustrates values of the state signals Q1 and Q2 when both the selection signals S1 and S2 represent "1" (=H level) in correlation with the four combinations of the ON/OFF states of the switches A, B, and C.

As illustrated in the truth table, the state signal Q1 becomes "1" only when the switch C is in the OFF state and the switch A is in the ON state, that is, the ON/OFF states of the switches A, B, and C are "100" or "110". Further, the state signal Q2 becomes "1" only when the switch B is in the ON state, that is, the ON/OFF states of the switches A, B, and C are "110" or "111". Therefore, corresponding to that the states of the switches A, B, and C change as "000"→"100"→"110"→"111", the state signals Q1 and Q2 change as "00"→"10"→"11"→"01". Thus, in this embodiment, the four types of the ON/OFF states which can be taken by the switches A, B, and C can be expressed by four combinations of values of the state signals Q1 and Q2 which differ from one another.

In this embodiment, as illustrated in the right top truth table of FIG. 2C, when the selection signal S1 representing "1" and the selection signal S2 representing "0" are applied, the state signal Q2 is forced to be "0" and the state signal Q1 is outputted as the state signal Q from the logical sum circuit OC1. Further, when the selection signal S1 representing "0" and the selection signal S2 representing "1" are applied, the state signal Q1 is forced to be "0" and the state signal Q2 is outputted as the state signal Q from the logical sum circuit OC1.

This concludes the operation of this embodiment.

According to this embodiment, the switch circuit IC11 includes two switches A and C, and performs a logical operation of the ON/OFF states of the switches and the selection signal S1. Accordingly, one switch circuit performs a logical operation using the ON/OFF states of two switches, and thus the number of selection lines can be reduced to be less than the number of switches. Further, the number of switch circuits is less than the number of switches, and thus the number of diodes provided in the logical sum circuit OC1 can be decreased. Thus, according to this embodiment, the number of wires and the number of parts related to the state detecting circuit for one key can be reduced in comparison with the conventional technology.

Further, in this embodiment, in the switch circuit IC11 including the two switches A and C, in the process where the ON/OFF states of the switches A and C changes as "00"→"10"→"10"→"11", the state signal Q1 changes as "0"→"1"→"1"→"0". Thus, in the switch circuit IC11 including the two switches A and C, the state signal Q1 becomes "0" in both when the ON/OFF states of the switches A and C are "00" and when they are "11". Therefore, when the state signal Q1 is "0", it is not possible to determine only from the state signal Q1 whether the state signal Q1 is "0" because the ON/OFF states of the switches A and C are "00", or the state signal Q1 is "0" because the ON/OFF states of the switches A and C are "11".

However, in this embodiment, the respective thresholds th1, th2, and th3 of the switches A, B, and C are in the relation of th1<th2<th3. Thus, when the switch B is in the ON state and the state signal Q2 represents "1", the switch A must be in the ON state. Therefore, when the state signal Q1 represents "0" and the state signal Q2 represents "1", the reason for the state signal Q1 to represent "0" is that the switch A is in the ON state and the switch C is in the ON state.

On the other hand, when the state signal Q2 represents "0", the switch B is in the OFF state, and in this case the switch C is in the OFF state. Therefore, when the state signal Q1 represents "0" and the state signal Q2 represents "0", the reason for the state signal Q1 to represent "0" is that the switch A is in the OFF state and the switch C is in the OFF state.

Thus, in this embodiment, when the state signal Q1 represents "0", it is possible to distinguish whether the ON/OFF states of the switches A and C are "00" or "11" based on whether the state signal Q2 represents "0" or "1". Therefore, according to this embodiment, four types of ON/OFF states which can be taken by the three switches A, B, and C can be expressed by the two-bit state signals Q1 and Q2 without duplication. This point is as illustrated in the truth tables of FIG. 2C.

Figure 3:
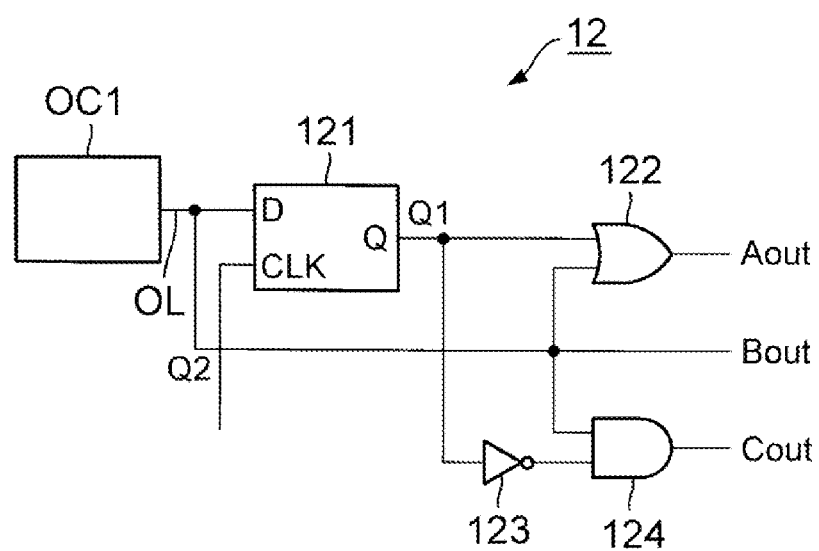
FIG. 3 is a circuit diagram illustrating a configuration of a state determining circuit 12 in the first embodiment.

FIG. 3 is a circuit diagram illustrating a configuration of the state determining circuit 12. This state determining circuit 12 converts the state signal Q (=Q1 or Q2 in accordance with the states of the selection signals S1 and S2) outputted by the state detecting circuit 10 into key press depth signals Aout, Bout, and Cout indicating ON/OFF states of the switches A, B, and C, respectively. As illustrated in FIG. 3, the state determining circuit 12 has a flip flop 121, a logical sum circuit 122, a logical negation circuit 123, and a logical product circuit 124.

The state signal Q outputted by the state detecting circuit 10 is inputted to a data terminal D of the flip flop 121, and a clock in synchronization with the switching timings of the selection signals S1 and S2 is supplied to a clock terminal CLK from a not-illustrated clock generator.

The logical sum circuit 122 outputs, as the signal Aout, a logical sum of an output signal of the flip flop 121 and the state signal Q outputted by the state detecting circuit 10. The state signal Q outputted by the state detecting circuit 10 is outputted as the signal Bout.

The logical product circuit 124 outputs, as the signal Cout, a logical product of a signal resulted from inverting the output signal of the flip flop 121 by the logical negation circuit 123 and the state signal Q outputted by the state detecting circuit 10.

Hereinafter, operation of the state determining circuit 12 will be described. First, when the selection signals S1 and S2 come to represent "1" and "0" respectively, the flip flop 121 takes in and outputs the state signal Q (=Q2) which has been outputted by the state detecting circuit 10, at a rising edge of the clock generated at this time point.

Next, when the selection signals S1 and S2 come to represent "0" and "1" respectively, the flip flop 121 takes in and outputs the state signal Q (=Q1) which has been outputted by the state detecting circuit 10, at a rising edge of the clock generated at this time point.

Then, the logical sum circuit 122 outputs, as the signal Aout, a logical sum of the state signal Q1 outputted by the flip flop 121 and the state signal Q2 outputted by the state detecting circuit 10. Here, as is clear from the two, lower left and right truth tables of FIG. 2C, the logical sum of the state signal Q1 and the state signal Q2 matches ON and OFF (="1" and "0") of the switch A. Therefore, the signal Aout indicates the ON/OFF state of the switch A as "1" and "0".

Further, the state signal Q (=Q2) outputted by the state detecting circuit 10 is outputted as the signal Bout. Here, as is clear from the two, lower left and right truth tables of FIG. 2C, the state signal Q2 matches ON and OFF (="1" and "0") of the switch B. Therefore, the signal Bout indicates the ON/OFF state of the switch B as "1" and "0".

Further, the logical product circuit 124 outputs, as the signal Cout, a logical product of the signal resulted from inverting the output signal Q1 outputted by the flip flop 121 by the logical negation circuit 123 and the state signal Q2 outputted by the state detecting circuit 10. Here, as is clear from the two, lower left and right truth tables of FIG. 2C, the logical product of the logically inverted value of the state signal Q1 and the state signal Q2 matches ON and OFF (="1" and "0") of the switch C. Therefore, the signal Cout indicates the ON/OFF state of the switch C as "1" and "0".

Thus, the state determining circuit 12 can generate key press depth signals Aout, Bout, and Cout indicating the ON/OFF states of the switches A, B, and C, respectively, based on the state signal Q (=Q1 or Q2 as above) outputted by the state detecting circuit 10.

Figure 4:
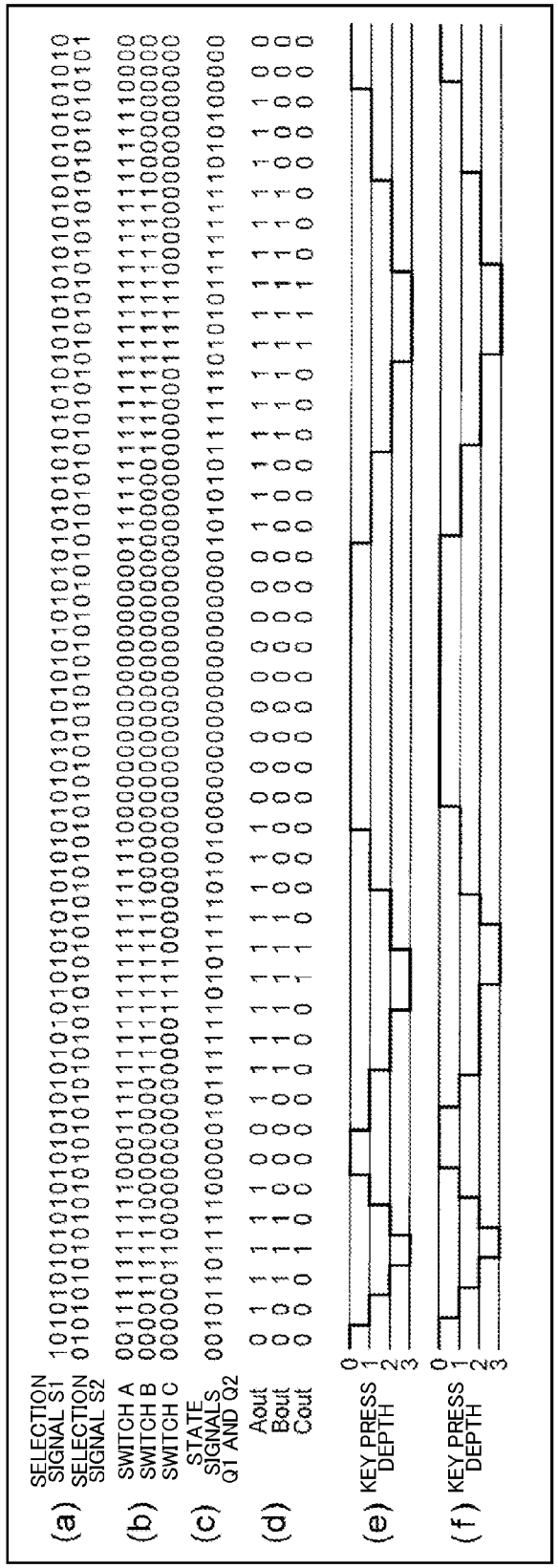
FIG. 4 is a time chart indicating an operation example of the state detecting circuit 10 and the state determining circuit 12 in FIG. 1.

FIG. 4 is a time chart indicating an operation example of the state detecting circuit 10 and the state determining circuit 12. In FIG. 4, (a) illustrates changes of the states of the selection signals S1 and S2. Further, (b) illustrates the ON/OFF states of the switches A, B, and C changing according to the key press depth. Further, (c) illustrates the states of the state signals Q1 and Q2 outputted by the state detecting circuit 10 based on the ON/OFF states of the switches A, B, and C illustrated in (b). Further, (d) illustrates the key press depth signals Aout, Bout, and Cout outputted by the state determining circuit 12 based on the state signals Q1 and Q2 illustrated in (c). Further, (e) is a graph indicating the key press depth indicated by the ON/OFF states of the switches A, B, and C of (b). There are four types, "0" to "3", of the key press depths. The key press depth of "0" causes all the switches A, B, C to be in the OFF state. The key press depth of "1" causes the switch A to be in the ON state and the switches B and C to be in the OFF state. The key press depth of "2" causes the switches A and B to be in the ON state and the switch C to be in the OFF state. The key press depth of "3" causes all the switches A, B, and C to be in the ON state. (f) is a graph indicating the key press depth indicated by the key press depth signals Aout, Bout, and Cout of (d).

The shape of the graph illustrated in (f) nearly matches the shape of the graph illustrated in (e), from which it can be seen that the state determining circuit 12 can accurately determine the ON/OFF states of the switches A to C. However, as described above, the state determining circuit 12 determines the ON/OFF states of the switches A to C based on the state signals Q1 and Q2 when the selection signal S2 represents "1". Therefore, if the ON/OFF states of the switches A to C change while the selection signal S1 switches from "1" to "0", an error occurs in the ON/OFF states of the switches A to C determined by the state determining circuit 12. Thus, an error of one bit due to this can be seen in the graph illustrated in (f) of FIG. 4. However, the changing cycle of "1" and "0" of the selection signals S1 and S2 is at a high speed (1 µs (microsecond) to 1 ms (millisecond)), and thus this error can be ignored. Therefore, the state determining circuit 12 can accurately determine the ON/OFF states of the switches A to C.

FIG. 5 is a block diagram illustrating a detailed configuration example of the key press detecting circuit 1 using the state detecting circuit 10 and the state determining circuit 12 which are explained above. The key press detecting circuit 1 has a state detecting circuit group 10G constituted of eighty-eight state detecting circuits 10 corresponding respectively to eighty-eight keys which the keyboard instrument has, a control circuit 131, a multiplexer 132, and a demultiplexer 133. The state determining circuit 12 and the other circuit 13 which are described above are included in the control circuit 131.

The state detecting circuit group 10G is sectioned into first to seventh groups each constituted of twelve state detecting circuits 10 and an eighth group constituted of four state detecting circuits 10. FIG. 5 illustrates the state detecting circuits 10 of each group aligned in one row, and the state detecting circuits 10 constituting the state detecting circuit group 10G are illustrated in a matrix form.

In FIG. 5, the state detecting circuits 10 of one group forming one row detect the ON/OFF states of switches A, B, and C of respective keys in a one-octave range. The demultiplexer 133 is a circuit which sequentially selects each row of state detecting circuits 10 illustrated in FIG. 5 under control of the control circuit 131.

As illustrated in FIG. 5, the demultiplexer 133 is connected to state detecting circuits $10\_k$ (k=1 to 12) of the first row via two selection lines SL1 and SL2, connected to state detecting circuits $10\_k$ (k=13 to 24) of the second row via two selection lines SL3 and SL4, ... and connected to state detecting circuits $10\_k$ (k=85 to 88) of the eighth row via two selection lines SL15 and SL16.

Among these selection lines SL1 to SL16, the selection lines SL1, SL3, SL5, SL7, SL9, SL11, SL13, and SL15 serve the role of the selection line SL1 of previous FIG. 2A, and connected to the respective switch circuits IC11 of the state detecting circuits $10\_k$. Further, the selection lines SL2, SL4, SL6, SL8, SL10, SL12, SL14, and SL16 serve the role of the selection line SL2 of previous FIG. 2A, and connected to the respective switch circuits IC12 of the state detecting circuits $10\_k$.

The demultiplexer 133 supplies selection signals S1 to S16 to the state detecting circuit group 10G via the selection lines SL1 to SL16, respectively. Describing more specifically, the demultiplexer 133 cyclically repeats the operation of: with the selection signal S1 representing "1" and the other selection signals representing "0", making the state detecting circuits $10\_k$ (k=1 to 12) of the first row output state signals $Q1\_k$ (k=1 to 12) equivalent to the state signal Q1 of previous FIG. 2A; with the selection signal S2 representing "1" and the other selection signals representing "0", making the state detecting circuits $10\_k$ (k=1 to 12) of the first row output state signals $Q2\_k$ (k=1 to 12) equivalent to the state signal Q2 of previous FIG. 2A; with the selection signal S3 representing "1" and the other selection signals representing "0", making the state detecting circuits $10\_k$ (k=13 to 24) of the second row output state signals $Q1\_k$ (k=13 to 24) equivalent to the state signal Q1 of previous FIG. 2A; ...; and with the selection signal S16 representing "1" and the other selection signals representing "0", making the state detecting circuits $10\_k$ (k=85 to 88) of the eighth row output state signals $Q2\_k$ (k=85 to 88) equivalent to the state signal Q2 of previous FIG. 2A.

In the state detecting circuit group 10Q output lines OLj (j=1 to 12) for the twelve columns are wired corresponding to the respective columns of the state detecting circuits 10. In the state detecting circuit group 10G, respective output terminals of the state detecting circuits 10 of the j-th column are connected in common to the output line OLj. In previous FIG. 2A, the output terminal of the logical sum circuit OC1 of the state detecting circuit 10 is grounded via the resistance 101. In the configuration illustrated in FIG. 5, respective logical sum circuits OC1 of the state detecting circuits 10 constituting one column share one resistance 101. That is, in the configuration illustrated in FIG. 5, cathodes of the respective diodes 111 and 112 (see FIG. 2A) of the state detecting circuits 10 of one column are connected in common, this common connection point is connected to the output line OLj and grounded via the resistance 101, and output parts of the state detecting circuits 10 constitute a wired OR circuit.

The multiplexer 132, under control of the control circuit 131, cyclically repeats the operation of sequentially selecting output lines OL1 to OL12, and sequentially outputting the state signals $Q1\_k$ (1≤k≤88) and $Q2\_k$ (1≤k≤88) which are outputted from the output lines, to the control circuit 131.

The control circuit 131 controls the multiplexer 132 and the demultiplexer 133. Further, when taking in the state signals $Q1\_k$ (1≤k≤88) and $Q2\_k$ (1≤k≤88) from the multiplexer 132, the control circuit 131 determines which one of the state detecting circuits $10\_k$ (1≤k≤88) outputted the state signal, in relation with the selection signals S1 to S16 supplied to the demultiplexer 133.

For example, it is assumed that the control circuit 131 takes in the state signal via the output line OL4 when the selection signal S3 represents "1". In this case, the control circuit 131 handles the state signal as one outputted from the state detecting circuit 10_16 belonging to the position in the second row and the fourth column of the state detecting circuit group 10G.

The control circuit 131 controls the multiplexer 132 and the demultiplexer 133 such that the multiplexer 132 and the demultiplexer 133 cyclically repeats operation such that the multiplexer 132 sequentially selects the output lines OLj (j=1 to 12), and while the multiplexer 132 selects one output line OLj, the demultiplexer 133 sequentially outputs the selection signals S1 to S16 with a logical value of "1". Thus, while the multiplexer 132 selects the output line OL1, the control circuit 131 obtains from the multiplexer 132 the state signals Q1_1, Q2_1, Q1_13, Q2_13, ..., Q1_85, and Q2_85 outputted by the state detecting circuits 10 of the first column. Next, while the multiplexer 132 selects the output line OL2, the control circuit 131 obtains from the multiplexer 132 the state signals Q1_2, Q2_2, Q1_14, Q2_14, ..., Q1_86, and Q2_86 outputted by the state detecting circuits 10 of the second column. This continues on and on, and the control circuit 131 sequentially obtains state signals outputted by the state detecting circuits 10 of every row in the third column to the twelfth column.

The state determining circuit 12 included in the control circuit 131 generates, for example at a timing when the state signals Q1_1 and Q2_1 outputted by the state detecting circuit 10_1 are obtained from the multiplexer 132, the above-described signals Aout, Bout, and Cout from those state signals. Further, the state determining circuit 12 generates, for example at a timing when the state signals Q1_13 and Q2_13 outputted by the state detecting circuit 10_13 are obtained from the multiplexer 132, the above-described signals Aout, Bout, and Cout from those state signals. This continues on and on, and the state determining circuit 12 generates the above-described signals Aout, Bout, and Cout based on state signals obtained from the state detecting circuits 10 corresponding to the respective keys.

Then, the control circuit 131 cyclically repeats the processing of generating the signals Aout, Bout, and Cout based on the state signals outputted by the state detecting circuits 10 for every one of the eighty-eight keys, to thereby detect a pressed key, and to generate velocity information of the key press operation thereof by means of publicly known technology.

When the three switches A, B, and C are used for detecting a key press operation of one key, in the above-described conventional technology, three selection lines must be connected per state detecting circuit. Thus, the total number of selection lines in the key press detecting circuit 1 will be 264. On the other hand, in this embodiment, the number of selection lines wired to one state detecting circuit 10 is two. Thus, the total number of selection lines in the key press detecting circuit 1 in this embodiment is 176. Therefore, with the key press detecting circuit 1 of this embodiment, the number of selection lines can be decreased significantly compared to the conventional technology.

Further, in this embodiment, compared to the conventional technology, the number of diodes of the state detecting circuit 10 can be reduced by one. Therefore, in this embodiment, compared to the conventional technology, eighty-eight diodes can be reduced.

Second Embodiment

FIG. 6A is a circuit diagram illustrating a configuration of a state detecting circuit 20 as a second embodiment of the invention. Similarly to the state detecting circuit 10 of the first embodiment, a state detecting circuit 20 has three switches A, B, and C. In the first embodiment, all of the switches A, B, and C are key-on switches. On the other hand, in this embodiment, the switches B and C are key-on switches, but the switch A is a key-off switch which switches from the ON state to the OFF state by a key press. Thresholds th1, th2, and th3 of key press depths at which ON/OFF of the switches A, B, and C switches are in the relation th1<th2<th3 similarly to the first embodiment.

As illustrated in FIG. 6A, the state detecting circuit 20 is made by changing the switch circuit IC11 to a switch circuit IC21 in the state detecting circuit 10 of the first embodiment. The switch circuit IC21 has switches A and C interposed in parallel between the selection line SL1 and the anode of the diode 111 in the logical sum circuit OC1. A common connection point of the switches A and C and the anode of the diode 111 is an output terminal of the switch circuit IC21. The configuration of parts other than the switch circuit IC21 of the state detecting circuit 20 is the same as that in the above-described state detecting circuit 10. In FIGS. 6A and 6B, same symbols are added to parts in common with those in FIGS. 2A and 2B.

Figure 7A:
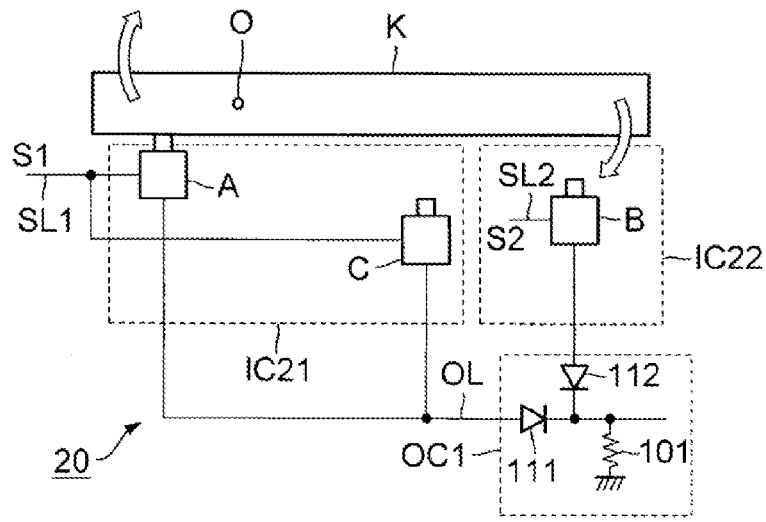
FIG. 7A is a side view illustrating an example of an attachment structure of switches A, B and C for detecting a key press in the second embodiment.
Figure 7B:
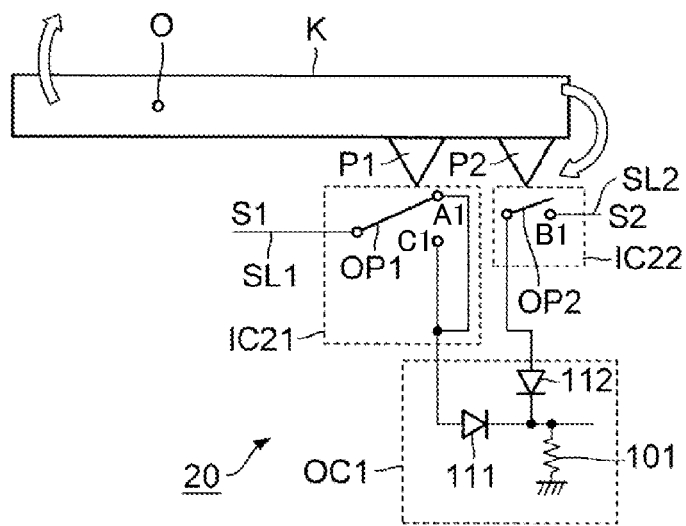
FIG. 7B is a side view illustrating another example of the same.

FIGS. 7A and 7B are side views illustrating an attachment structure of the switches A, B, and C in a lower part of the keyboard of a keyboard instrument. In FIGS. 7A and 7B, the right end of a key K is a front end facing toward the performer, and the left end thereof is a rear end thereof. The key K is supported on the keyboard at a fulcrum O. The key K turns in an arrow direction around the fulcrum O when the front end is pressed down. In the structural example illustrated in FIG. 7A, the switch A has a movable contact abutting on a lower surface of the rear end of the key K. Further, the switches B and C are located separately below a lower surface of the front end of the key K, and a movable contact of each of them faces the lower surface of the front end of the key K. Here, the movable contact of the switch C is at a position deeper than the movable contact of the switch B. Configurations of the switch circuits IC21 and IC22 are as illustrated in FIG. 6A.

In the configuration as above, when the key is not pressed, the movable contact of the switch A is pressed down by the lower surface of the rear end of the key K and is in contact with a fixed contact in the switch A. Thus, the switch A is in the ON state. When the performer presses down the front end of the key K, the key K turns in the direction of arrow around the fulcrum O. Accompanying this, the rear end of the key K moves upward, and thus the switch A turns off. When the key K is pressed down further, the lower surface of the front end of the key K presses down the movable contact of the switch B, and thus the switch B turns on. When the key K is pressed down furthermore, a lower surface of a front end of the switch B presses down the movable contact of the switch C, and thus the switch C turns on. As described above, the functions of the switches A to C of FIG. 6A are achieved.

In the configuration example illustrated in FIG. 7B, press-down parts P1 and P2 having a projecting shape are provided on the lower surface of the front end of the key K. The switches A and C are constituted of a movable contact OP1 constituted of a conductive member and fixed contacts A1 and C1. The switch B is constituted of a movable contact OP2 constituted of a conductive member and a fixed contact B1. Among the fixed contacts A1, B1, and C1, the fixed contact A1 is located highest. The fixed contact B1 is lower than the fixed contact A1, and the fixed contact C1 is lower than the fixed contact B1. The movable contacts OP1 and OP2 are located below the press-down parts P1 and P2, respectively.

In the configuration as above, when the key is not pressed, the press-down parts P1 and P2 on the lower surface of the front end of the key K are separated from the movable contacts OP1 and OP2. In this state, the movable contact OP1 is in contact with the fixed contact A1, the switch A is in the ON state, and the switch C is in the OFF state. Further, the movable contact OP2 is separated from the fixed contact B1, and the switch B is in the OFF state. When the performer presses down the front end of the key K, the key K turns in the direction of arrow around the fulcrum O. Accompanying this, first, the press-down part P1 on the lower surface of the front end of the key K presses down the movable contact OP1 to release it from the fixed contact A1. Thus, the switch A turns off. When the key K is pressed down further, the press-down part P2 on the lower surface of the front end of the key K presses down the movable contact OP2 to make the movable contact OP2 come in contact with the fixed contact B1. Thus, the switch B turns on. When the key K is pressed down furthermore, the press-down part P1 on the lower surface of the front end of the key K makes the movable contact OP1 come in contact with the fixed contact C1. Thus, the switch C turns on. As described above, the functions of the switches A to C of FIG. 6A are achieved.

FIG. 6B is an equivalent logic circuit diagram in which the elements of the state detecting circuit 20 illustrated in FIG. 6A are replaced with logical symbols. Signals A, B, and C in the diagram indicate the ON/OFF states of the switches A, B, and C, respectively. In this embodiment, the key-on switches B and C turn on every time an operation of pressing is performed, and thus, for the signals B and C, it is assumed that "1" represents the ON state and "0" represents the OFF state. On the other hand, the key-off switch A turns off every time an operation of pressing is performed, and thus, for the signal A, it is assumed that "1" represents the OFF state and "0" represents the ON state.

In FIG. 6A, when the selection signal S1 represents "1" and the switch A is in the ON state, or when the selection signal S1 represents "1" and the switch C is in the ON state, the state signal Q1 becomes "1". Further, when the selection signal S1 represents "0", the state signal Q1 becomes "0" irrespective of the ON/OFF states of the switches A and C. Thus, the switch circuit IC21 is equivalent to a logic circuit constituted of a logical product circuit IC21_1 outputting a logical product of a logically inverted value of the signal A and the selection signal S1, a logical product circuit IC21_2 outputting a logical product of the signal C and the selection signal S1, and a logical sum circuit IC21_3 outputting, as a state signal Q1, a logical sum of an output signal of the logical product circuit IC21_1 and an output signal of the logical product circuit IC21_2. Equivalent circuits of the switch circuit IC12 and the logical sum circuit OC1 are the same as those in the first embodiment.

FIG. 6C illustrates truth tables illustrating operation of the state detecting circuit 20 in this embodiment. The left truth table of FIG. 6C illustrates in a vertical direction transitions of the ON/OFF states of the switches A, B, and C when the key press depth is increased. In a state that there is no key press, the ON/OFF states of the switches A, B, and C are ON, OFF, and OFF represented by "000". Further, when the key is pressed and it becomes a state of th1<key press depth<th2, the ON/OFF states of the switches A, B, and C are OFF, OFF, and OFF represented by "100". Further, when it becomes a state of th2<key press depth<th3, the ON/OFF states of the switches A, B, and C are OFF, ON, and OFF represented by "110". Then, when it becomes a state of key press depth>th3, the ON/OFF states of the switches A, B, and C are OFF, ON, and ON represented by "111". Thus, the ON/OFF states of the switches A, B, and C can take any one of four states depending on the key press depth.

The right bottom truth table of FIG. 6C illustrates the state signals Q1 and Q2 when both the selection signals S1 and S2 represent "1" in correlation with the four ON/OFF states of the switches A, B, and C.

As illustrated in this truth table, the state signal Q1 becomes "1" only when the switch A is in the ON state and the switch C is in the OFF state, that is, "000", and when the switch A is in the OFF state and the switch C is in the ON state, that is, "111". Further, the state signal Q2 becomes "1" only when the switch B is in the ON state, that is, "110" or "111". Therefore, corresponding to that the states of the switches A, B, and C change as "000"→"100"→"110"→"111", the state signals Q1 and Q2 change as "10"→"00"→"01"→"11". Thus, in this embodiment, the four types of ON/OFF states which can be taken by the switches A, B, and C can be expressed by four combinations of values of the state signals Q1 and Q2 which differ from one another.

In this embodiment, as illustrated in the right top truth table of FIG. 6C, when the selection signal S1 representing "1" and the selection signal S2 representing "0" are applied, the state signal Q2 is forced to be "0" and the state signal Q1 is outputted as the state signal Q from the logical sum circuit OC1. Further, in this embodiment, when the selection signal S1 representing "0" and the selection signal S2 representing "1" are applied, the state signal Q1 is forced to be "0" and the state signal Q2 is outputted as the state signal Q from the logical sum circuit OC1.

This concludes the operation of this embodiment.

In this embodiment, similar effects as those in the first embodiment can also be obtained. Further, in this embodiment, by providing the key-off switch A and the key-on switch C in the switch circuit IC21, the resistance 102 of the first embodiment can be omitted. Accordingly, the number of parts of the state detecting circuit 20 for one key can be decreased.

Figure 8:
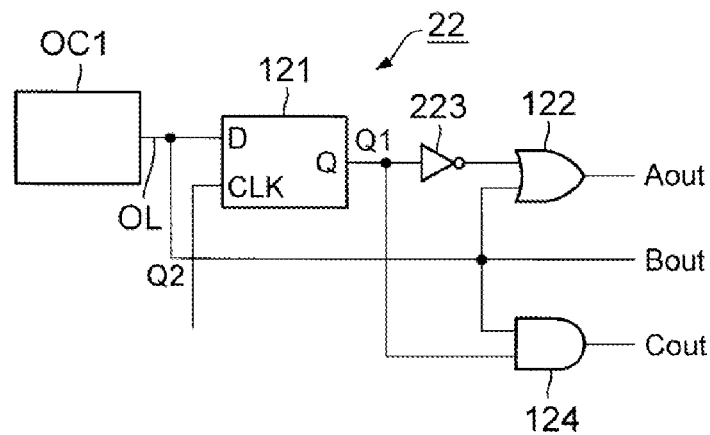
FIG. 8 FIG. 8 is a circuit diagram illustrating a configuration of a state determining circuit 22 in the second embodiment.

FIG. 8 is a circuit diagram illustrating a configuration of a state determining circuit 22 in this embodiment. As illustrated in FIG. 8, in the state determining circuit 12 of the first embodiment, the logical negation circuit 123 is interposed between the flip flop 121 and the logical product circuit 124 (see FIG. 3). On the other hand, in the state determining circuit 22 of this embodiment, the logical negation circuit 123 is absent, and instead of this, a logical negation circuit 223 is interposed between the flip flop 121 and the logical sum circuit 122. The configuration of other parts of the state determining circuit 22 is the same as that of the state determining circuit 12. Therefore, same symbols are added to parts in common with those in the state determining circuit 12, and detailed explanations thereof are omitted.

Hereinafter, operation of the state determining circuit 22 will be explained. In this embodiment, in a state that the selection signals S1 and S2 come to represent "0" and "1" respectively, the logical sum circuit 122 outputs, as the signal Aout, a logical sum of a signal resulted from logically inverting the state signal Q1 outputted by the flip flop 121 and the state signal Q2 outputted by the state detecting circuit 10. Here, as is clear from the two, lower left and right truth tables of FIG. 6C, the logical sum of the logically inverted value of the state signal Q1 and the state signal Q2 matches OFF and ON (="1" and "0") of the switch A. Therefore, the signal Aout indicates the ON/OFF state of the switch A as "0" and "1".

Further, the state signal Q (=Q2) outputted by the state detecting circuit 10 is outputted as the signal Bout. Here, as is clear from the two, lower left and right truth tables of FIG. 6C, the state signal Q2 matches ON and OFF (="1" and "0") of the switch B. Therefore, the signal Bout indicates the ON/OFF state of the switch B as "1" and "0".

Further, the logical product circuit 124 outputs, as the signal Cout, a logical product of the state signal Q1 outputted by the flip flop 121 and the state signal Q2 outputted by the state detecting circuit 10. Here, as is clear from the two, lower left and right truth tables of FIG. 6C, the logical product of the state signal Q1 and the state signal Q2 matches ON and OFF (="1" and "0") of the switch C. Therefore, the signal Cout indicates the ON/OFF state of the switch C as "1" and "0".

Thus, the state determining circuit 22 can generate key press depth signals Aout, Bout, and Cout individually indicating the ON/OFF states of the switches A, B, and C, respectively.

Third Embodiment

FIG. 9A is a circuit diagram illustrating a configuration of a state detecting circuit 30 as a third embodiment of the present invention. As illustrated in FIG. 9A, the state detecting circuit 30 has switch circuits IC11 and IC12 similarly to the state detecting circuit 10 illustrated in the first embodiment. However, in this embodiment, the switch circuits IC11 and IC12 are not connected individually to the selection lines SL1 and SL2 as in the first embodiment but are connected to a common selection line FL, and a common selection signal F is given via the selection line FL. Further, the state detecting circuit 30 is not provided with any circuit equivalent to the logical sum circuit OC1 illustrated in FIGS. 2A and 2B. In this embodiment, state signals Q1 and Q2 outputted by the switch circuits IC11 and IC12 are outputted to output lines OL1 and OL2 via diodes 311 and 312, respectively. Respective cathodes of these diodes 311 and 312 are output terminals of the state detecting circuit 30.

FIG. 9B is an equivalent logical circuit diagram of the state detecting circuit 30 in this embodiment, and FIG. 9C illustrates truth tables illustrating operation of the state detecting circuit 30. As illustrated in these diagrams, the functions and operation of the switch circuits IC11 and IC12 of the state detecting circuit 30 are similar to those of the first embodiment. In this embodiment, the state signals Q1 and Q2 respectively outputted by the switch circuits IC11 and IC12 of the state detecting circuit 30 are supplied to a circuit equivalent to the state determining circuit 12 of the first embodiment.

Figure 10:
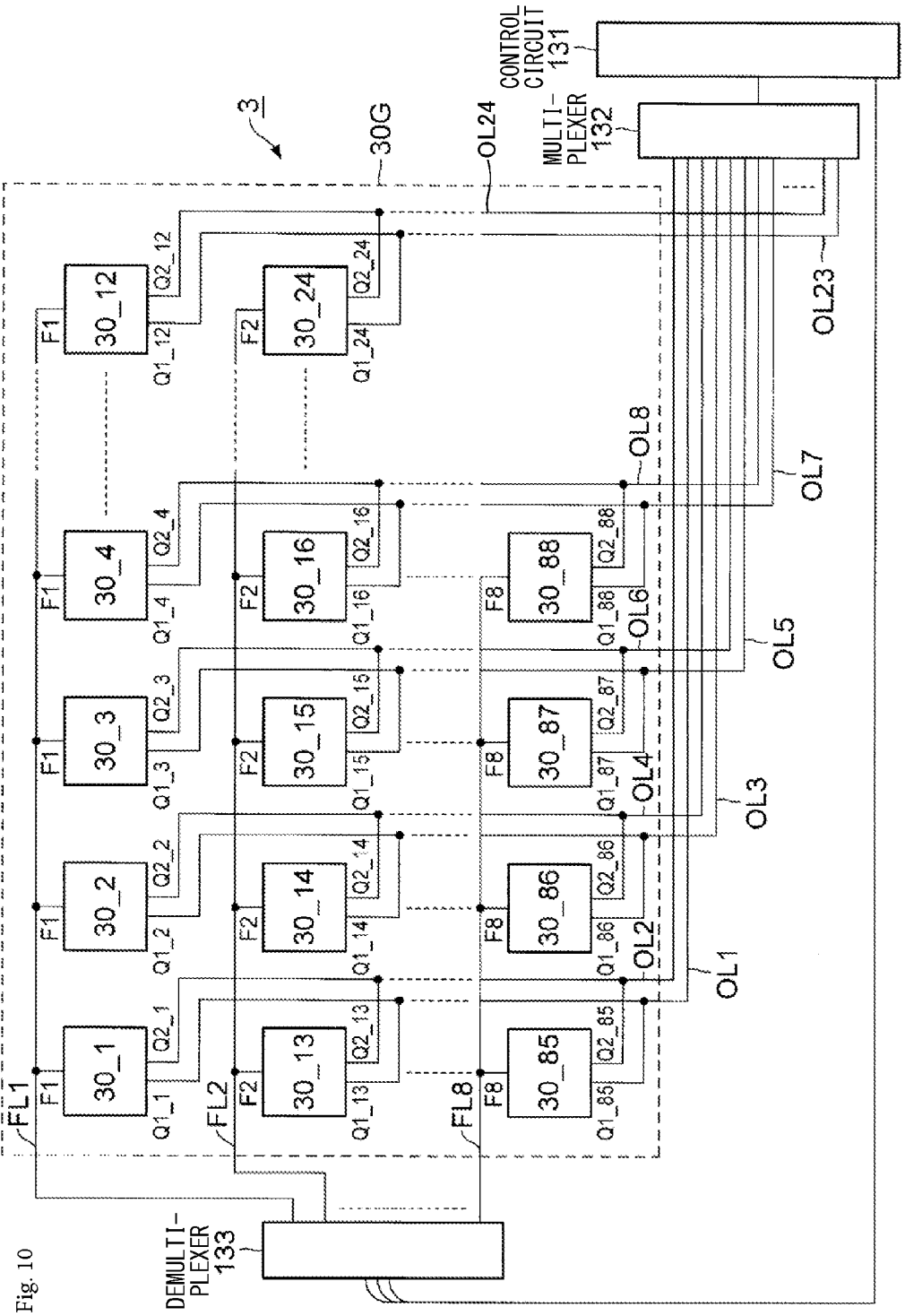
FIG. 10 is a block diagram illustrating a detailed configuration example of a key press detecting circuit 3 using the state detecting circuit 30 according to the third embodiment.

FIG. 10 is a block diagram illustrating a detailed configuration example of the key press detecting circuit 3 using the state detecting circuit 30 as explained above and the state determining circuit 12 of the first embodiment. The key press detecting circuit 3 has a state detecting circuit group 30G constituted of eighty-eight state detecting circuits 30 corresponding respectively to eighty-eight keys provided in keyboard instrument, a control circuit 131, a multiplexer 132, and a demultiplexer 133.

The state detecting circuit group 30G is sectioned into first to seventh groups each constituted of twelve state detecting circuits 30 and an eighth group constituted of four state detecting circuits 30. FIG. 10 illustrates the state detecting circuits 30 of each group aligned in one row, and the state detecting circuits 30 constituting the state detecting circuit group 30G are illustrated in a matrix form. In FIG. 10, the state detecting circuits 10 of one group forming one row detect the ON/OFF states of switches A, B, and C of respective keys in a one-octave range.

The demultiplexer 133 is a circuit which sequentially selects each row of state detecting circuits 30 illustrated in FIG. 10 under control of the control circuit 131. As illustrated in FIG. 10, the demultiplexer 133 is connected to state detecting circuits 30_k (k=1 to 12) of the first row via a selection line FL1, connected to state detecting circuits 30_k (k=13 to 24) of the second row via a selection line FL2, . . . and connected to state detecting circuits 30_k (k=85 to 88) of the eighth row via a selection line FL8. These selection lines FL1 to FL8 serve the role of the selection line FL of previous FIG. 9A, and connected to the respective switch circuits IC11 and IC12 of the state detecting circuits 30_k.

The demultiplexer 133 supplies selection signals F1 to F8 to the state detecting circuit group 30G via the selection lines FL1 to FL8, respectively. Describing more specifically, the demultiplexer 133 cyclically repeats the operation of: with the selection signal F1 representing "1" and the other selection signals representing "0", making the state detecting circuits 30_k (k=1 to 12) of the first row output state signals Q1_k (k=1 to 12) and state signals Q2_k (k=1 to 12); with the selection signal F2 representing "1" and the other selection signals representing "0", making the state detecting circuits 30_k (k=13 to 24) of the second row output state signals Q1_k (k=13 to 24) and state signals Q2_k (k=13 to 24); and with the selection signal F8 representing "1" and the other selection signals representing "0", making the state detecting circuits 30_k (k=85 to 88) of the eighth row output state signals Q1_k (k=85 to 88) and state signals Q2_k (k=85 to 88).

In the state detecting circuit group 30G, output lines OL1 and OL2 corresponding to the first column, output lines OL3 and OL4 corresponding to the second column, . . . , output lines OL23 and OL24 corresponding to the twelfth column are wired corresponding to the respective columns of the state detecting circuits 30. Then, in the state detecting circuit group 30G output terminals of the state signals Q1 of the state detecting circuits 30 of the first column are connected in common to the output line OL1, and output terminals of the state signals Q2 thereof are connected in common to the output line OL2.

Describing more specifically, cathodes of the respective diodes 311 of the state detecting circuits 30 of one column (see FIG. 9A) are connected in common, the common connection point is connected to the output line OL1 and grounded via a resistance (not illustrated), and output parts of the state signals Q1 of the state detecting circuits 30 constitute a wired OR circuit. Further, cathodes of the respective diodes 312 of the state detecting circuits 30 of one column (see FIG. 8A) are connected in common, the common connection point is connected to the output line OL1 and grounded via a resistance (not illustrated), and output parts of the state signals Q2 of the state detecting circuits 30 constitute a wired OR circuit. The same applies to the other columns.

The multiplexer 132, under control of the control circuit 131, cyclically repeats the operation of sequentially selecting output lines OL1 to OL24, and sequentially outputting the state signals, which are outputted from the selected output lines, to the control circuit 131.

The control circuit 131 makes the multiplexer 132 sequentially select the output lines OLj (j=1 to 24). Then, while the multiplexer 132 selects the output line OL1 for example, the control circuit 131 makes the demultiplexer 133 sequentially output the selection signals F1 to F8 with a logical value of "1". Thus, the control circuit 131 obtains from the multiplexer 132 the state signals Q1_1, Q1_13, . . . , Q1_85 outputted by the state detecting circuits 30 of the first column.

Next, while the multiplexer 132 selects the output line OL2, the control circuit 131 makes the demultiplexer 133 sequentially output the selection signals F1 to F8 with a logical value of "1". Thus, the control circuit 131 obtains from the multiplexer 132 the state signals Q2_1, Q2_13, . . . , Q2_85 outputted by the state detecting circuits 30 of the first column.

The state determining circuit 12 included in the control circuit 131 generates, for example at a timing when the state signals Q1_1 and Q2_1 outputted by the state detecting circuit 30_1 are obtained, the above-described key press depth signals Aout, Bout, and Cout from those state signals. Further, the state determining circuit 12 generates, for example at a timing when the state signals Q1_13 and Q2_13 outputted by the state detecting circuit 30_13 are obtained, the above-described key press depth signals Aout, Bout, and Cout from those state signals. The first column is taken as an example, but the same applies to the other columns.

The state determining circuit 12 generates the above-described key press depth signals Aout, Bout, and Cout based on the state signals obtained from the state detecting circuits 30 corresponding to the keys. Then, the control circuit 131 cyclically repeats the processing of generating the key press depth signals Aout, Bout, and Cout from the state signals outputted by the state detecting circuits 30 for every one of the eighty-eight keys, to thereby detect pressed keys, and to generate velocity information of the key press operation thereof by means of publicly known technology.

In this embodiment, similar effects as those in the first embodiment can also be obtained.

Fourth Embodiment

Generalization of the State Detecting Circuit

In this embodiment, various modifications are made to the state detecting circuit in the first embodiment, and operations thereof are studied, so as to generalize the state detecting circuit of the invention.

FIG. 11A is a diagram illustrating the relation of a key press depth and state signals Q1 and Q2 in a state that both the selection signals S1 and S2 represent "1" in the switch circuits IC11 and IC12 of the first embodiment (FIG. 2). In FIG. 11A, the vertical direction indicates the key press depth. Further, two columns of rectangles extending in the vertical direction represent the state signals Q1 and Q2, respectively. Horizontal lines in middle of rectangles denote thresholds th1, th2, and th3 of key press depths at which the ON/OFF states of the switches A, B, and C of FIG. 2 switches.

In the switch circuit IC11 outputting the state signal Q1 illustrated in FIG. 11A, when the key press depth exceeds the threshold th1, the states of the switches A and C switch from OFF and OFF to ON and OFF, and when the key press depth exceeds the threshold th3 (>th1), the states of the switches A and C switch from ON and OFF to ON and ON. That is, the switch circuit IC11 has three states regarding the states of the switches A and C, that is, OFF-OFF state, ON-OFF state, and ON-ON state. In this sense, the switch circuit IC11 can be grasped as a three-state switch circuit including two switches.

Then, the state signal Q1 outputted by the three-state switch circuit IC11, as illustrated in FIG. 11A, is inverted from the first value "0" to the second value "1" when the key press depth exceeds the threshold th1, and returns from the second value "1" to the first value "0" when the key press depth exceeds the threshold th3. Thus, in the three-state switch circuit IC11, in both of a section of the key press depth where the switches A and C are in the OFF-OFF state and a section of the key press depth where the switches A and C are in the ON-ON state, the state of the state signal Q1 is common, and it is not possible to determine whether the switches A and C are in the OFF-OFF state or in the ON-ON state only based on the state signal Q1.

On the other hand, in the switch circuit IC12 outputting the state signal Q2 illustrated in FIG. 11A, when the key press depth exceeds the threshold th2 (th1<th2<th3), the state of the switch B switches from the OFF state to the ON state. Thus, the switch circuit IC12 has two states, the state where the switch B is in the OFF state and the state where the switch B is in the ON state. In this sense, the switch circuit IC12 can be grasped as a two-state switch circuit including one switch.

Then, the state signal Q2 outputted by the two-state switch circuit IC12 is, as illustrated in FIG. 11A, inverted from the first value "0" to the second value "1" when the key press depth exceeds the threshold th2. Thus, in the two-state switch circuit IC12, the state of the state signal Q2 are not common in the state where the switch B is in the OFF state and in the state where the switch B is in the ON state.

Accordingly, it can be determined whether the switch B is in the OFF state or in the ON state only based on the state signal Q2.

Then, as illustrated in FIG. 11A, the threshold th2 of the two-state switch circuit IC12 is between the thresholds th1 and th3 of the three-state switch circuit IC11. Accordingly, even though the state of the state signal Q1 is common in the section where the key press depth is shallower than the threshold th1 and the section where it is deeper than the threshold th3, it is possible to distinguish whether the key press depth is in the former section or the latter section based on the state ("0" or "1") of the state signal Q2. Further, by the threshold th2 of the two-state switch circuit IC12, the section where the state signal Q1 represents "1" is divided into a section where th1<key press depth<th2 and a section where th2<key press depth<th3. Therefore, in the section where the state signal Q1 represents "1", it is possible to distinguish whether the key press depth is in the section where th1<key press depth<th2 or the section where th2<key press depth<th3 based on the state ("0" or "1") of the state signal Q2.

Therefore, with the circuit configuration having the three-state switch circuit IC11 and the two-state switch circuit IC12, it is possible to express four states, that is, the state where the switches A, B and C are OFF, OFF, and OFF (key press depth<th1), the state where the switches A, B, and C are ON, OFF, and OFF (th1<key press depth<th2), the state where the switches A, B, and C are ON, ON, and OFF (th2<key press depth<th3), and the state where the switches A, B, and C are ON, ON, and ON, based on the states of the state signals Q1 and Q2 which are not duplicated.

Thus, in order to prevent duplication of the states of the state signals Q1 and Q2, the threshold of the two-state switch circuit is important. As illustrated in FIG. 11A, when the threshold th2 of the two-state switch circuit IC12 is located between the thresholds th1 and th3 of the three-state switch circuit IC11, by adding the state signal Q2 with respect to the state signal Q1 with the duplicated state in the section where key press depth<th1 and the section where key press depth>th3, it is possible to express the ON/OFF states of all the switches A, B, and C by the entire state signals Q1 and Q2 without duplication.

On the other hand, when the two-state switch circuit outputting the state signal Q2 has the smallest threshold th1 and the three-state switch circuit outputting the state signal Q1 has the thresholds th2 and th3 larger than the threshold th1 as illustrated in FIG. 11B, it is not possible to express all the ON/OFF states of the switches A, B, and C without duplication by the entire state signals Q1 and Q2. This is because, in this case, the section where the key press depth is shallower than the threshold th2 and the state signal Q1 represents "0" is divided into two sections by the state signal Q2, but due to this, the state signals Q1 and Q2 represents "01" in both the section where th1<key press depth<th2 and the section where key press depth>th3. Although not illustrated, the same result is obtained when the threshold of the two-state switch circuit is larger than the two thresholds of the three-state switch circuit.

Next, in order to generalize the state detecting circuit according to the invention, a state detecting circuit with a plurality of three-state switch circuits will be considered. FIG. 12A illustrates an operation example of a state detecting circuit obtained by combining a three-state switch circuit outputting a state signal Q1, a three-state switch circuit outputting a state signal Q2, and a two-state switch circuit outputting a state signal Q3.

In this example, the three-state switch circuit outputting a state signal Q1 has thresholds th1 and th5 where th1<th5. In this three-state switch circuit, in two sections, the section where the key press depth is shallower than the smaller threshold th1 and the section where the key press depth is deeper than the larger threshold th5, the state signal Q1 represents the first value "0", and the state of the state signal Q1 is common.

The three-state switch circuit outputting a state signal Q2 has thresholds th2 and th4 where th1<th2<th4<th5. In this three-state switch circuit, in two sections, the section where the key press depth is shallower than the smaller threshold th2 and the section where the key press depth is deeper than the larger threshold th4, the state signal Q2 represents the first value "0", and the state of the state signal Q2 is common.

Here, the section where key press depth<th2 (section where the state signal Q2 represents the first value "0") includes the section where key press depth<th1 (section where the state signal Q1 represents the first value "0"). Further, the section where key press depth>th4 (section where the state signal Q2 represents the first value "0") includes the section where key press depth>th5 (section where the state signal Q1 represents the first value "0"). Therefore, the state signal Q2 is ineffective for distinguishing whether the state signal Q1 representing the first value "0" indicates the section where key press depth<th1 or indicates the section where key press depth>th5.

Further, as a result of providing the three-state switch circuit outputting the state signal Q2, in addition to that the state signals Q1 and Q2 represents "00" in two sections, the section where key press depth<th1 and the section where key press depth>th5, the state signals Q1 and Q2 represents "10" in two sections, the section where th1<key press depth<th2 and the section where th4<key press depth<th5. Thus, when two three-state switch circuits are provided in which sections between their respective two thresholds have an inclusion relation (in this example, the section between the thresholds th2 and th4 is included in the section between the thresholds th1 and th5), there arise two pairs of duplicated sections where one pair is sandwiched between the other pair (in this example, a pair of the section where key press depth<th1 and the section where key press depth>th5, and a pair of the section where th1<key press depth<th2 and the section where th4<key press depth<th5).

However, in the example illustrated in FIG. 12A, the two-state switch circuit outputting a state signal Q3 has a threshold th3 where th2<th3<th4. The state signal Q3 outputted by the two-state switch circuit is inverted at the threshold th3 being a boundary. Therefore, with the state ("0" or "1") of the state signal Q3, it is possible to distinguish the section where key press depth<th1 and the section where key press depth>th5 (pair of the duplicated sections where the state signals Q1 and Q2 represents are "00"), and distinguish the section where th1<key press depth<th2 and the section where th4<key press depth<th5 (pair of the duplicated sections where the state signals Q1 and Q2 represents "10").

Similarly to when there is one three-state switch circuit (see FIG. 11A), when there are two three-state switch circuits, the threshold of the two-state switch circuit is important in order to prevent duplication of the statuses of the state signals Q1, Q2, and Q3. If, as illustrated in FIG. 12B, the two-state switch circuit outputting the state signal Q3 has the smallest threshold th1, the three-state switch circuit outputting the state signal Q1 has thresholds th2 and th5 larger than the threshold th1, and the three-state switch circuit outputting the state signal Q2 has thresholds th3 and th4 where th2<th3<th4<th5, it is not possible to express all the ON/OFF states of the switches of the switch circuits without duplication based on the entire state signals Q1, Q2, and Q3. This is because, in this case, the section where the key press depth is shallower than the threshold th2 and the state signal Q1 represents "0" is divided into two sections by the state signal Q3, but due to this, the state signals Q1, Q2, and Q3 represents "001" in both the section where th1<key press depth<th2 and the section where key press depth>th5.

In the example illustrated in FIG. 12C, the three-state switch circuit outputting the state signal Q1 has the smallest threshold th1 and the largest threshold th5. Further, the three-state switch circuit outputting the state signal Q2 has thresholds th3 and th4, where th1<th3<th4<th5. The two-state switch circuit outputting the state signal Q3 has a threshold th2, where th1<th2<th3. Also in this case, in two sections, the section where th2<key press depth<th3 and the section where th4<key press depth<th5, the state signals Q1, Q2, and Q3 represents "101", and the states of the state signals Q1, Q2, Q3 are duplicated.

Although not illustrated, also when the threshold of the two-state switch circuit is inside the sections of the thresholds th4 to th5 of FIG. 12A and when it is in a section larger than the threshold th5, the states of the state signals Q1, Q2, and Q3 are duplicated.

Thus, in the configuration constituted of the two three-state switch circuits in which sections between respective two thresholds have an inclusion relation and one two-state switch circuit, in order to generate the state signals Q1, Q2, and Q3 expressing all sections resulted from dividing all the range of the key press depth by the thresholds of the switch circuits without duplication, the threshold of the two-state switch circuit must be located in the innermost section among the sections formed by the respective two thresholds of the three-state switch circuits.

The case where there is one three-state switch circuit and the case where there are two have been explained above, but the same applies when there are three or more three-state switch circuits.

FIG. 13A illustrates state signals Q1, Q2, Q3, and Q4 which can be obtained from three three-state switch circuits and one two-state switch circuit. In this example, the three-state switch circuit outputting the state signal Q1 has the smallest threshold th1 and the largest threshold th7. The three-state switch circuit outputting the state signal Q2 has thresholds th2 and th6, where th1<th2<th6<th7. The three-state switch circuit outputting the state signal Q3 has thresholds th3 and th5, where th2<th3<th5<th6. The two-state switch circuit outputting the state signal Q4 has a threshold th4, where th3<th4<th5. By setting the thresholds of each switch circuit in this manner, as illustrated in FIG. 13A, eight sections obtained by dividing the total range of the key press depth by the seven thresholds th1 to th7 can be expressed with the state signals Q1, Q2, Q3, and Q4 without duplication. The same applies to the case where there are four or more three-state switch circuits.

As described above, when sections between respective two thresholds of the plurality of three-state switch circuits have an inclusion relation, it is possible to avoid duplication of the states of the state signals by adding the two-state switch circuit having a threshold inside the innermost sections of these sections. However, the situation where adding such a two-state switch circuit successfully avoids duplication of the states of state signals is not limited to the case where there is an inclusion relation among the sections between respective two thresholds of the plurality of three-state switch circuits.

In the example illustrated in FIG. 13B, the relation between the threshold th5 and the threshold th6 of FIG. 13A is replaced. Then, in the example illustrated in FIG. 13B, there is an inclusion relation between the section between the thresholds th1 and th7 of the three-state switch circuit outputting the state signal Q1 and the section between the thresholds th2 and th5 of the three-state switch circuit outputting the state signal Q2. However, there is no inclusion relation between the section between the thresholds th2 and th5 of the three-state switch circuit outputting the state signal Q2 and the section between the thresholds th3 and th6 of the three-state switch circuit outputting the state signal Q3. However, in the example illustrated in FIG. 13B, the threshold th4 of the two-state switch circuit outputting the state signal Q4 is in the section between the thresholds th3 and th5. As a result, the state signals Q1, Q2, Q3, and Q4 express the eight sections sectioned by the seven thresholds th1 to th7 in the total range of the key press depth without duplication, as illustrated in FIG. 13B.

In the case where a plurality of three-state switch circuits and one two-state switch circuit are present, when thresholds of the switch circuits are sorted in ascending order, it is just necessary for the threshold of the two-state switch circuit to have the next order of the largest threshold among the respective smaller thresholds of the plurality of three-state switch circuits. Here, there arises in the plurality of three-state switch circuits a pair of duplicated sections of the state signals on the lower limit side and the upper limit side of the range of the key press depth. However, when the threshold of the two-state switch circuit is set as described above, the threshold of the two-state switch circuit is located between respective duplicated sections of the pair of duplicated sections of the plurality of three-state switch circuits. Accordingly, the two duplicated sections where the states of the state signals from each of the plurality of three-state switch circuits are common can be distinguished based on the state ("0" or "1") of the state signal outputted by the two-state switch circuit.

This embodiment provides a state detecting circuit which satisfies the following conditions based on the above consideration.
a. It has one or more three-state switch circuits.
b. When thresholds of the switch circuits are sorted in ascending order, it has a two-state switch circuit having a threshold which has the next order of the largest threshold among the respective smaller thresholds of the plurality of three-state switch circuits.

According to this embodiment, it is possible to generate state signals representing all the sections obtained by dividing the entire range of the key press depth by thresholds of the switch circuits without duplication.

Note that although in the example considered above there is one two-state switch circuit, the number of two-state switch circuits may be two or more. Since the state signal outputted by the two-state switch circuit is just inverted at one threshold being the boundary, it will not be duplicated in two different sections. Therefore, when the states of the state signals outputted by the other switch circuits are not common in two sections, no duplication will occur in two sections in the states of the state signals outputted by all the circuits in which one more two-state switch circuit is added with respect to the other switch circuits.

Fifth Embodiment

Further Generalization of the State Detecting Circuit

In this embodiment, further considerations are made on the achievements of the fourth embodiment, so as to further generalize the state detecting circuit of the present invention.

In the fourth embodiment, it has been explained that there arise a pair of duplicated sections where the states of the state signals are common in the three-state switch circuit, and that the two-state switch circuit helps to distinguish two sections of the pair of duplicated sections. Here, what kind of duplicated sections will arise when there is a plurality of three-state switch circuits will be considered.

When there are two three-state switch circuits, the relation of the sections between respective two thresholds of the two three-state switch circuits is one of the following three relations of FIGS. 14A to 14C.

In the example illustrated in FIG. 14A, as also illustrated in FIG. 12A and FIG. 13A, the section between thresholds th1 and th4 of the three-state switch circuit outputting the state signal Q1 includes the section between thresholds th2 and th3 of the three-state switch circuit outputting the state signal Q2. In this case, a section X1a where key press depth<th1 and a section X1b where key press depth>th4 forms a pair of duplicated sections, and a section X2a where th1<key press depth<th2 and a section X2b where th3<key press depth<th4 forms another pair of duplicated sections.

In the example illustrated in FIG. 14B, the section between thresholds th1 and th3 of the three-state switch circuit outputting the state signal Q1 and the section between thresholds th2 and th4 of the three-state switch circuit outputting the state signal Q2 are partially overlap with each other. Describing more specifically, there is established a relation such that the smaller threshold th2 of one three-state switch circuit is sandwiched between the thresholds th1 and th3 of the other three-state switch circuit, and the larger threshold th3 of the other three-state switch circuit is sandwiched between the thresholds th2 and th4 of above one three-state switch circuit. In this case, there only arise a pair of duplicated sections constituted of a section Xa where key press depth<th1 and a section where key press depth>th4.

In the example illustrated in FIG. 14C, the section between thresholds th1 and th2 of the three-state switch circuit outputting the state signal Q1 and the section between thresholds th3 and th4 of the three-state switch circuit outputting the state signal Q2 do not overlap with each other and are separated from each other. In this case, the states of the state signals Q1 and Q2 are common in a section Xa where key press depth<th1, a section Xb where key press depth>th4, and a section Xc where th2<key press depth<th3.

Next, a method of solving the duplicated sections which arise in the examples illustrated in FIGS. 14A to 14C will be considered. The method to solve the duplicated sections which arise in the example illustrated in FIG. 14A is as already described in the fourth embodiment. That is, as illustrated in FIG. 15A, it is just necessary to provide the threshold th3 of the two-state switch circuit within the innermost section (sections between the thresholds th2 and th4 in FIG. 14A) among the sections between respective two thresholds of the three-state switch circuits.

In the example illustrated in FIG. 14B, there is only a pair of duplicated sections constituted of the sections Xa and Xb. Therefore, if the threshold of the two-state switch circuit is provided between the sections Xa and Xb, it is possible to distinguish the sections Xa and Xb by the state ("0" or "1") of the state signal of the two-state switch circuit.

In the example illustrated in FIG. 15B, there is provided a two-state switch circuit having a threshold th2 between the smaller threshold th1 of the three-state switch circuit outputting the state signal Q1 and the smaller threshold th3 of the three-state switch circuit outputting the state signal Q2. Further, in the example illustrated in FIG. 15D, there is provided a two-state switch circuit having a threshold th4 between the larger threshold th3 of the three-state switch circuit outputting the state signal Q1 and the larger threshold th5 of the three-state switch circuit outputting the state signal Q2.

A similar relation is established in the configuration having three or more three-state switch circuits. In the example illustrated in FIG. 16A, the larger threshold th2 of the three-state switch circuit outputting the state signal Q2 is sandwiched between the thresholds th1 and th3 of the three-state switch circuit outputting the state signal Q1. Further, the larger threshold th4 of the three-state switch circuit outputting the state signal Q3 is sandwiched between the thresholds th2 and th5 of the three-state switch circuit outputting the state signal Q2. In this example, the larger threshold th3 of the three-state switch circuit outputting the state signal Q1 is smaller than the smaller threshold th4 of the three-state switch circuit outputting the state signal Q3. In this case, there arise only a pair of duplicated sections constituted of the section where key press depth<th1 and the section where key press depth>th6.

Further, the example of FIG. 16B has a similar relation. The difference between FIG. 16A and FIG. 16B is only that the relation of magnitude between the larger threshold of the three-state switch circuit outputting the state signal Q1 and the smaller threshold of the three-state switch circuit outputting the state signal Q3 is reversed. Also in the example illustrated in FIG. 16B, there arise only a pair of duplicated sections constituted of the section where key press depth<th1 and the section where key press depth>th6 is generated. Although not illustrated, a configuration having four or more three-state switch circuits also has a similar relation.

Thus, when a plurality of three-state switch circuits are provided, and between the larger threshold and the smaller threshold of each of the three-state switch circuits, only one of thresholds of another three-state switch circuits is included, there arise only a pair of duplicated sections constituted of the section of the key press depth smaller than the smallest threshold and the section of the key press depth larger than the largest threshold among the thresholds which the plurality of three-state switch circuits have. Therefore, if the two-state switch circuit having a threshold between the smallest threshold and the largest threshold among the thresholds which the plurality of three-state switch circuits have is provided, such state signals that can express all sections obtained by dividing the entire range of the key press depth by thresholds of the switch circuits without duplication can be generated.

In the example illustrated in FIG. 14C, the states of the state signals are common in sections Xa, Xb, and Xc. Accordingly, in order to eliminate duplication of the states of the state signals in the entire state detecting circuit, it is necessary to provide a configuration for distinguishing the sections Xa and Xc and a configuration for distinguishing the sections Xc and Xb.

In the example illustrated in FIG. 15C, there are provided a two-state switch circuit which has a threshold th2 between the thresholds th1 and th3 of the three-state switch circuit outputting the state signal Q1 and outputs a state signal Q3, and a two-state switch circuit which has a threshold th5 between the thresholds th4 and th6 of the three-state switch circuit outputting the state signal Q2 and outputs a state signal Q4. The sections Xa and Xc in FIG. 14C can be distinguished by the state ("0" or "1") of the state signal Q3, and the sections Xc and Xb can be distinguished by the state ("0" or "1") of the state signal Q4.

FIG. 15E illustrates another example of eliminating duplication of the states of the state signals in the sections Xa, Xb, and Xc in FIG. 14C. In this example, there is provided a three-state switch circuit which has a threshold th2 between the thresholds th1 and th3 of the three-state switch circuit outputting the state signal Q1 and a threshold th6 between thresholds th5 and th7 of the three-state switch circuit outputting the state signal Q2, and outputs a state signal Q3. In this case, the three three-state switch circuits outputting the three state signals Q1, Q2, and Q3 are circuits illustrated in FIG. 16A (strictly, circuits in which the positional relation of the state signals Q2 and Q3 of FIG. 16A is reversed is FIG. 15E). Then, in the example illustrated in FIG. 15E, there is provided a two-state switch circuit which has a threshold th4 between the smallest threshold th1 and the largest threshold th7 and outputs a state signal Q4. Also in the configuration illustrated in FIG. 15E, duplication of the states of the state signals in the sections Xa, Xb, and Xc of FIG. 14C can be eliminated.

To summarize the above, there are following measures for solving duplicated sections of state signals which arise due to the three-state switch circuits.

a. In a three-state switch circuit, there arise duplicated sections of state signals in a section where the key press depth is shallower than the smaller one of two thresholds and in a section where the key press depth is deeper than the larger threshold thereof. In order to eliminate the duplicated sections of the state signals, it is just necessary to provide a two-state switch circuit having a threshold between the two thresholds of the three-state switch circuit.

b. When the sections between respective two thresholds of a plurality of three-state switch circuits have an inclusion relation, there arise a plurality of pairs of duplicated sections sandwiching the innermost sections of these sections. In order to solve these duplicated sections, it is just necessary to provide a two-state switch circuit having a threshold inside the innermost section.

c. When a plurality of three-state switch circuits are provided, and between the larger threshold and the smaller threshold of each of the three-state switch circuits, only one of thresholds of another three-state switch circuits is included, there arise only a pair of duplicated sections constituted of the section of the key press depth smaller than the smallest threshold and the section of the key press depth larger than the largest threshold among the thresholds which the plurality of three-state switch circuits have. Therefore, in order to solve this pair of duplicated sections, it is just necessary to provide a two-state switch circuit having a threshold between the smallest threshold and the largest threshold among the thresholds which the plurality of three-state switch circuits have.

d. When a plurality of three-state switch circuits are provided, and sections between two thresholds of each of the three-state switch circuits do not overlap with sections between two thresholds of another three-state switch circuits, a section of the key press depth shallower than the smallest threshold among thresholds of the three-state switch circuits, sections between the sections between two thresholds of the three-state switch circuits, and a section of the key press depth deeper than the largest threshold among the thresholds of the three-state switch circuits are duplicated sections of the state signals. Therefore, in order to eliminate these duplicated sections, it is just necessary to provide two-state switch circuits each having a threshold between these duplicated sections.

FIG. 17 is a truth table illustrating operation of a state detecting circuit implementing all of the above solutions of duplicated sections. In this example, in the section between thresholds th1 and th6 of the three-state switch circuit outputting a state signal Q1, the section between thresholds th2 and th5 of the three-state switch circuit outputting a state signal Q2 is included. Further, in the section between thresholds th2 and th5 of the three-state switch circuit outputting a state signal Q2, the section between thresholds th3 and th4 of the three-state switch circuit outputting a state signal Q3 is included.

Further, in this example, there are provided a three-state switch circuit having thresholds th7 and th10 and outputting a state signal Q4, a three-state switch circuit having thresholds th8 and th11 and outputting a state signal Q5, and a three-state switch circuit having thresholds th9 and th12 and outputting a state signal Q6, which are among thresholds having the relation of th6<th7<th8<th9<th10<th11<th12<th13.

Further, in this example, there are provided a three-state switch circuit having thresholds th13 and th14 satisfying the relation of th12<th13<th14<th15 and outputting a state signal Q7, a three-state switch circuit having thresholds th15 and th16 satisfying the relation of th14<th15<th16<th17 and outputting a state signal Q8, a three-state switch circuit having thresholds th17 and th18 satisfying the relation of th16<th17<th18 and outputting a state signal Q9.

As a result of providing three-state switch circuits in this manner, duplicated sections of the state signals arise in section X1 where key press depth<th1, section X2 where th6<key press depth<th7, section X3 where th12<key press depth<th13, section X4 where th14<key press depth<th15, section X5 where th16<key press depth<th17, and section X6 key press depth>th18. Further, pairs of duplicated sections are a pair of section where th1<key press depth<th2 and section where th5<key press depth<th6, and a pair of section where th2<key press depth<th3 and section where th4<key press depth<th5.

Accordingly, in the state detecting circuit illustrated in FIG. 17, a two-state switch circuit having a threshold tha between the thresholds th3 and th4 and outputting a state signal Qa is provided. By the state ("0" or "1") of the state signal Qa, the duplicated sections X1 and X2 can be distinguished, the section where th1<key press depth<th2 and the section where th5<key press depth<th6 can be distinguished, and moreover, the section where th2<key press depth<th3 and the section where th4<key press depth<th5 can be distinguished.

Further, in the state detecting circuit illustrated in FIG. 17, a two-state switch circuit having a threshold thb between the thresholds th7 and th8 and outputting a state signal Qb is provided. By the state ("0" or "1") of the state signal Qb, the duplicated sections X2 and X3 can be distinguished. Note that the threshold thb may be any other threshold as long as it satisfies th7<thb<th12.

Further, in the state detecting circuit illustrated in FIG. 17, there are provided a two-state switch circuit having a threshold the between the thresholds th13 and th14 and outputting a state signal Qc, a two-state switch circuit having a threshold thd between the thresholds th15 and th16 and outputting a state signal Qd, and a two-state switch circuit having a threshold the between the thresholds th17 and th18 and outputting a state signal Qe. Therefore, the duplicated sections X3 and X4 can be distinguished by the state ("0" or "1") of the state signal Qc, the duplicated sections X4 and X5 can be distinguished by the state ("0" or "1") of the state signal Qd, and the duplicated sections X5 and X6 can be distinguished by the state ("0" or "1") of the state signal Qe.

In order to reduce the number of parts and the number of wires, it is desired to decrease the two-state switch circuits as much as possible. Therefore, in order to reduce the number of parts and the number of wires, a preferred mode is a configuration in which sections between thresholds of all three-state switch circuits have an inclusion relation, or a configuration in which sections between thresholds of each three-state switch circuit overlap with sections between thresholds of other three-state switch circuits.

Other Embodiments

In the foregoing, various embodiments of the invention have been explained, but other embodiments can be envisaged for the invention. The following are examples.

(1) In the above-described embodiments, the state detecting circuit is configured by positive logic, but it may be configured by negative logic. That is, it may be configured such that when the selection signal or the fixed signal is at low level, a state signal is outputted from the switch circuit to the logical sum circuit.

(2) In the above-described embodiments, the invention is applied to a state detecting circuit used for a key press detecting circuit of a keyboard, but the target of application of the invention is not limited to this. The invention can be applied to a state detecting circuit which detects the state of any switch which switches between the ON state and the OFF state in response not only to the key press depth of a keyboard instrument but also to changes in any other physical amount. For example, in an electronic wind instrument or the like controlling volume and so on according to a wind pressure, the state detecting circuits of the invention may be applied to circuits or the like which detect ON/OFF states of a plurality of switches which switch between the ON state and the OFF state according to a wind pressure, and then calculate the wind pressure.

(3) In the above-described embodiments, there are provided state detecting circuits outputting state signals which express all sections obtained by dividing the entire range of the key press depth by thresholds of the switches without duplication. However, even when duplication of the states of the state signals occurs in sections of part of all the sections obtained by dividing the entire range of the key press depth by thresholds of switches, depending on the application. It is possible that such partial duplication of the states of the state signals does not adversely affect circuits in the subsequent stage. For example, in the example illustrated in FIG. 16A, duplication of the states of the state signals occurs in the section where key press depth<th1 and the section where key press depth>th6, but there may be cases where detection of these sections is not important, or the like. Further, when the states of the state signals are duplicated, there may also be cases where it is possible to estimate the current section from the previously detected section. Therefore, in such cases, a configuration in which the states of the state signals are partially duplicated may be employed.

REFERENCE SIGNS LIST

11 . . . selection signal generating circuit; 10, 20, and 30 . . . state detecting circuit; IC11, IC21, and IC12 . . .

switch circuit; OC1, and 122 . . . logical sum circuit; SL1, SL2, SL3, FL1, and FL2 . . . selection line; S1, S2, S3, F1, and F2 . . . selection signal; OL, OL1, and OL2 . . . output line; Q1 to Q9 and Qa to Qe . . . state signal; 101, 102, and 301 . . . resistance; 111, 112, and 113 . . . diode; 12 and 22 . . . state determining circuit; 121 . . . flip flop; 123 and 223 . . . logical negation circuit; 124 . . . logical product circuit; 1 and 3 . . . key press detecting circuit; 10G and 30G . . . state detecting circuit group; 131 . . . control circuit; 132 . . . multiplexer; 133 . . . demultiplexer; K . . . key; OP1 and OP2 . . . movable contact; P1 and P2 . . . press-down part.

The invention claimed is:

1. A state detecting circuit comprising:
a plurality of switch circuits, each of the plurality of switch circuits comprising at least one switch which switches between an ON state and an OFF state in response to a change in a physical amount which is a target of detection, each of the plurality of switch circuits configured to output a state signal which changes according to an ON/OFF state of the switch included in the switch circuit itself,
wherein the plurality of the switch circuits include one or a plurality of three-state switch circuit comprising two switches in which thresholds of the physical amount at which the switch switches between the ON state and the OFF state are different from each other, configured to invert the state signal when the physical amount exceeds a smaller one of the thresholds of the two switches, and further configured to invert the state signal when the physical amount exceeds a larger one of the thresholds of the two switches,
wherein the plurality of switch circuits include at least one two-state switch circuit having a threshold between the thresholds of the two switches of the three-state switch circuit, and configured to invert the state signal when the physical amount exceeds the threshold.

2. The state detecting circuit according to claim 1, wherein the plurality of switch circuits include the plurality of three-state switch circuits, and the switch of the two-state switch circuit has, assuming that the thresholds of the physical amount at which the respective switches of the plurality of switch circuits switch between the ON state and the OFF state are sorted in ascending order, a threshold in a next order of a largest threshold among the smaller thresholds among the thresholds of the respective two switches of the plurality of three-state switch circuits.

3. The state detecting circuit according to claim 1, wherein the plurality of switch circuits include the plurality of three-state switch circuits, sections between the thresholds of the respective two switches of the plurality of three-state switch circuits have an inclusion relation, and a switch of the two-state switch circuit has a threshold inside an innermost section among the sections having the inclusion relation.

4. The state detecting circuit according to claim 1, wherein the plurality of switch circuits include the plurality of three-state switch circuits, and in the plurality of the three-state switch circuits, a section between the thresholds of the two switches of at least one of the three-state switch circuits overlaps with a section between the thresholds of the two switches of another one of the three-state switch circuits, and a switch of the two-state switch circuit has a threshold between a largest threshold and a smallest threshold among the thresholds of the respective switches of the plurality of three-state switch circuits.

5. The state detecting circuit according to claim 1, wherein the plurality of switch circuits include, as the plurality of three-state switch circuits, two three-state switch circuits in which sections between the thresholds of the two switches of the respective three-state switch circuits do not overlap with each other, and has, as the at least one two-state switch circuit, a two-state switch circuit having a switch with a threshold between thresholds of the two switches of one of the two three-state switch circuits and a two-state switch circuit having a switch with a threshold between thresholds of the two switches of another one of the two three-state switch circuits.

6. The state detecting circuit according to claim 1, wherein one of the two switches of the three-state switch circuit is a key-on switch, and the other of the two switches is a key-off switch.

7. A key-press detector for detecting key press depth of a key on a keyboard, comprising:
a state detecting circuit comprising:
a plurality of switch circuits, each of the plurality of switch circuits comprising at least one switch which switches between an ON state and an OFF state in response to a change in a physical amount which is a target of detection, each of the plurality of switch circuits configured to output a state signal which changes according to an ON/OFF state of the switch included in the switch circuit itself,
wherein the plurality of the switch circuits include one or a plurality of three-state switch circuit comprising two switches in which thresholds of the physical amount at which the switch switches between the ON state and the OFF state are different from each other, configured to invert the state signal when the physical amount exceeds a smaller one of the thresholds of the two switches, and further configured to invert the state signal when the physical amount exceeds a larger one of the thresholds of the two switches, and
wherein the switches comprised of the switch circuits are provided in a lower part of the key such that each of the switches comprised of the switch circuits switches when the key is pressed down to an amount corresponding to the threshold of the switch.

8. A musical instrument comprising a keyboard and the key-press detectors according to claim 7,
wherein the key-press detectors are provided to correspond to respective keys of the keyboard for detecting key press depth of the corresponding key.

* * * * *